US006579655B1

(12) United States Patent
Shimomura et al.

(10) Patent No.: US 6,579,655 B1
(45) Date of Patent: Jun. 17, 2003

(54) LASER-HEAT TRANSFER RECORDING METHOD AND IMAGE-RECEIVING SHEET

(75) Inventors: Akihiro Shimomura, Shizuoka (JP); Yoshiharu Sasaki, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/146,047

(22) Filed: May 16, 2002

(30) Foreign Application Priority Data

May 17, 2001 (JP) ....................................... 2001-147983

(51) Int. Cl.[7] .............................. G03F 7/34; G03F 7/38
(52) U.S. Cl. ........................ 430/200; 430/201; 347/212
(58) Field of Search ................................ 430/200, 201; 347/212

(56) References Cited

U.S. PATENT DOCUMENTS 6,458,504 B2 * 10/2002 Wachi et al. ............... 430/200

FOREIGN PATENT DOCUMENTS

| | | |
|---|---|---|
| JP | 6-079980 A | 3/1994 |
| JP | 8-267944 A | 10/1996 |
| JP | 10-119329 A | 5/1998 |
| JP | 2000-071634 A | 3/2000 |
| JP | 2000-127636 A | 5/2000 |
| JP | 2000-141722 A | 5/2000 |
| JP | 2000-247493 A | 9/2000 |
| JP | 2001-171238 A | 6/2001 |

* cited by examiner

*Primary Examiner*—Richard L. Schilling
(74) *Attorney, Agent, or Firm*—Sughrue Mion, PLLC

(57) ABSTRACT

A laser-heat transfer recording method comprising the image-recording steps of feeding an image-receiving sheet and a heat transfer sheet to an exposure-recording unit, fixing the image-forming layer in the heat transfer sheet and the image-receiving layer in the image-receiving sheet being superposed vis-a-vis on a recording medium fixing member of the exposure-recording unit; irradiating the heat transfer sheet with laser beams corresponding to image data; and transferring the irradiated are with laser beam of the image-forming layer onto the image-receiving layer in the image-receiving sheet, wherein the surfaces of the image-receiving sheet and/or the heat transfer sheet are cleaned by being brought into contact with an adhesive roll of a crown shape for removing foreign matters, the diameter of the central part of which is larger than the diameters of both ends in the axis direction of the roll body, provided at at least one of the feeding part of the image-receiving sheet and the heat transfer sheet of the exposure-recording unit, a carrying part and a recording part, and the adhesive strength of the image-receiving layer and the underlayer of the image-receiving layer in the image-receiving sheet is from 20 to 100 mN/cm.

5 Claims, 8 Drawing Sheets

LASER-HEAT TRANSFER RECORDING METHOD AND IMAGE-RECEIVING SHEET

FIELD OF THE INVENTION

The present invention relates to a multicolor image-forming method for forming a full color image of high resolution by irradiation with laser beams. In particular, the present invention relates to a multicolor image-forming method which is useful in the field of printing for forming a color proof (DDCP: direct digital color proof) or a mask image from digital image signals by laser recording.

BACKGROUND OF THE INVENTION

In the field of graphic arts, printing of a printing plate is performed with a set of color separation films formed from a color original by a lith film. In general, color proofs are formed from color separation films before actual printing work for checking an error in the color separation step and the necessity for color correction. Color proofs are desired to realize high resolution which makes it possible to surely reproduce a half tone image and high performances such as high stability of processing. Further, for obtaining color proofs closely approximating to an actual printed matter, it is preferred to use materials which are used in actual printing as the materials for making color proofs, e.g., the actual printing paper as the base material and pigments as the coloring materials. As the method for forming a color proof, a dry method not using a developing solution is strongly desired.

As the dry method for forming color proofs, a recording system of directly forming color proofs from digital signals has been developed with the spread of electronized system in preprocessing of printing (pre-press field) in recent years. Such electronized system aims at forming in particular high quality color proofs, generally reproducing a dot image of 150 lines/inch or higher. For recording a proof of high image quality from digital signals, laser beams capable of modulation by digital signals and capable of finely diaphragming recording lights are used as recording heads. Therefore, the development of an image-forming material having high recording sensitivity to laser beams and exhibiting high resolution property capable of reproducing highly accurate dots is required.

As the recording material for use in a transfer image-forming method using laser beams, a heat fusion transfer sheet comprising a support having thereon in the order of a light-to-heat converting layer which absorbs laser beams and generates heat, and an image-forming layer which contains a pigment dispersed in components such as a heat fusion type wax and a binder is known (JP-A-5-58045 (the term "JP-A" as used herein means an "unexamined published Japanese patent application")). In an image-forming method using such a recording material, the heat generated at the area of a light-to-heat converting layer irradiated with laser beams fuses an image-forming layer corresponding to the irradiated area, and the fused layer is transferred to an image-receiving sheet arranged on a transfer sheet by lamination, thus a transferred image is formed on the image-receiving sheet.

Further, a heat transfer sheet comprising a support having provided thereon in the order of a light-to-heat converting layer containing a light-to-heat converting material, an extremely thin heat-peeling layer (from 0.03 to 0.3 $\mu$m), and an image-forming layer containing a coloring material is disclosed in JP-A-6-219052. In the heat transfer sheet, the bonding strength between the image-forming layer and the light-to-heat converting layer bonded through the intervening heat-peeling layer is reduced by laser beam irradiation, as a result, a highly accurate image is formed on an image-receiving sheet arranged on the heat transfer sheet by lamination. The image-forming method by the heat transfer sheet utilizes so-called ablation, specifically the heat-peeling layer partially decomposes at the area irradiated with laser beams and vaporizes, thereby the bonding strength of the image-forming layer and the light-to-heat converting layer at the irradiated area is reduced and the image-forming layer at that area is transferred to the image-receiving sheet laminated thereon.

These image-forming methods have advantages such that an actual printing paper provided with an image-receiving layer (an adhesion layer) can be used as the material of an image-receiving sheet, a multicolor image can be easily obtained by transferring images different in colors in sequence on the image-receiving sheet, and highly accurate image can be easily obtained. Therefore, these methods are useful for forming a color proof (DDCP: direct digital color proof) or a highly accurate mask image.

For shortening the time required in laser recording when an image is recorded with laser beams, laser beams comprising multi-beams using a plurality of laser beams are used in recent years. When recording is performed using a conventional heat transfer sheet by laser beams of multi-beam, there are cases where the image density of the transferred image formed on an image-receiving sheet is insufficient. The reduction of image density is particularly conspicuous in the case of laser recording with high energy. As a result of the investigation by the present inventors, it was found that the reduction of image density was attributable to transfer unevenness caused by irradiation with high energy laser beams.

Now, there are cases where foreign matters, e.g., dusts, adhere to a recording medium-feeding part, a recording medium-carrying part and printing part in a recording unit and the surface of a recording medium in transportation due to static electricity, and if printing is performed without removing these foreign matters, the foreign matters present between an image-receiving sheet and a heat transfer sheet cause a clear spot and those present between a recording drum and an image-receiving sheet or between a heat transfer sheet and a roller cause image defect such as ring-like unevenness. Accordingly, to remove the foreign matters adhered to the surfaces of the carrying route of a recording medium and a recording part in a recording unit, an adhesive rubber roller (a cleaning roller) is arranged to remove the adhered substance periodically or according to necessity by pressing the adhesive roller against the objective faces of foreign matter removal, to thereby maintain good recording condition.

However, since ordinarily used adhesive rollers are of a type of straight shape of constant roller diameter in the entire width direction, the pressure at the central part of the width direction of the roller weakens due to the deflection of the roller, as a result the degree of adhesion of the roller with recording media lowers and the performance of removing foreign matters is reduced. Further, there is a case where the adhesive force of adhesive rubber materials or adhesive substance used in adhesive rollers lowers by natural aging, therefore, the performance of rollers of removing foreign matters is deteriorated in a couple of months after the production. Due to the reduction of the performance of rubber rollers of removing foreign matters on a printing medium, image defect is sometimes caused such that a desired image is not printed on a recorded image.

On the other hand, there is another problem that by the application of high pressure or by the use of an adhesive roller made of strongly adhesive material, excessive adhesive force is caused and accompanied by peeling of the surface layers such as an image-receiving layer and a cushioning layer of an image-receiving sheet in transportation, and the deviation of the position of an image-receiving sheet fixed on a fixing part of a recording medium, which lead to an image failure of the obtained image.

SUMMARY OF THE INVENTION

Accordingly, the present invention aims at solving the problems of the prior art technique and to accomplish the following objects. That is, the objects of the present invention are: 1) a heat transfer sheet can provide excellent sharpness of dots and stability by transfer of a membrane of coloring material, which is not influenced by light sources of illumination as compared with the pigment material and the printed matter, 2) an image-receiving sheet can receive stably and surely the image-forming layer in a heat transfer sheet by laser energy, 3) transfer to actual printing paper can be effected corresponding to the range of from 64 to 157 $g/m^2$ such as art paper (coat paper), mat paper and finely coated paper, delicate texture can be imaged, and a high-key part can be reproduced accurately, and 4) extremely stable transfer releasability can be obtained. A further object of the present invention is to provide a method for forming a multicolor image capable of forming an image having good image quality and stable transfer image density on an image-receiving sheet even when recording is performed by multi-beam laser beams of high energy under different temperature and humidity conditions.

In particular, the object of the present invention is to provide a heat transfer recording method by laser irradiation capable of forming a transfer image having good image quality free of image defects due to foreign matters such as dusts.

A contract proof substituting proofs of an analog style color proof becomes necessary in this film-less CTP (computer-to-plate) age. For obtaining the approval of customers, color reproduction which coincides with the printed matters and analog style color proof is required, and the present inventors have developed DDCP system capable of transfer to actual paper without generating moire by using the same pigment materials as used in the printing inks. That is, this object has been realized by a large sized direct digital color proof (A2/B2) high in approximation to a printed matter and capable of transfer to actual paper and capable of using the same pigment materials as used in the printing inks. The system of the present invention is a system adopting laser membrane transfer, using pigment coloring materials and capable of transferring to actual paper by performing actual dot recording.

The above objects of the pre sent invention have been attained by the following means.

(1) A laser-heat transfer recording method comprising the image-recording steps of feeding an image-receiving sheet having an image-receiving layer and a heat transfer sheet comprising a support having provided thereon at least a light-to-heat converting layer and an image-forming layer to an exposure-recording unit; fixing the image-forming layer in the heat transfer sheet and the image-receiving layer in the image-receiving sheet being superposed vis-a-vis on a recording medium fixing member of the exposure-recording unit; irradiating the heat transfer sheet with laser beams corresponding to image data; and transferring the irradiated area with laser beams of the image-forming layer on the image-receiving layer in the image-receiving sheet; wherein the surface of the image-receiving sheet is cleaned by being brought into contact with an adhesive roll of a crown shape for removing foreign matters, the diameter of the central part of which is larger than the diameters of both ends in the axis direction of the roll body, provided at at least one of the feeding part of the image-receiving sheet and the heat transfer sheet of the exposure-recording unit, a carrying part and a recording part, and the adhesive strength of the image-receiving layer and the underlayer of the image-receiving layer in the image-receiving sheet is from 20 to 100 mN/cm.

(2) The laser-heat transfer recording method as described in the above item (1), wherein the static friction coefficient of the image-receiving layer surface in the image-receiving sheet is 0.7 or less.

(3) The laser-heat transfer recording method as described in the above item (1) or (2), wherein the surface roughness Rz of the image-receiving layer surface in the image-receiving sheet is from 1 to 5 μm.

(4) The laser-heat transfer recording method as described in the above item (1), (2) or (3), wherein pressing controlling members made of a harder material than the material of the adhesive member are provided at both ends of the adhesive roll.

(5) The laser-heat transfer recording method as described in the above item (1), (2), (3) or (4), wherein the cleaning of the surface of the image-receiving sheet by the adhesive roll comprises the steps of fixing the image-receiving sheet on the recording medium-fixing member, cleaning the surface from almost the central part of the relative moving direction of the image-receiving sheet toward one end of the relative moving direction by keeping the adhesive roll in contact with the surface; and thereafter cleaning the surface from almost the central part of the relative moving direction of the image-receiving sheet toward another end of the relative moving direction by keeping the adhesive roll in contact with the surface.

(6) An image-receiving sheet for use in a laser-heat transfer recording unit equipped with an adhesive roll of a crown shape for removing foreign matters, the diameter of the central part of which is larger than the diameters of both ends in the axis direction of the roll body, at at least one of a feeding part of a recording medium, a carrying part and a recording part, wherein the adhesive strength of the image-receiving layer and the underlayer of the image-receiving layer is from 20 to 100 mN/cm.

DESCRIPTION OF REFERENCE NUMERALS

Figure 1:
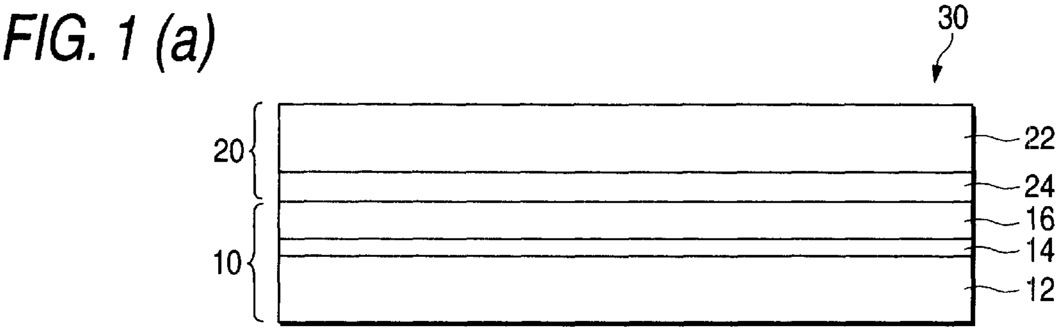
FIGS. 1(*a*), 1(*b*) and 1(*c*) are drawings showing the outline of the scheme of multicolor image-forming by membrane heat transfer by irradiation with a laser.
Figure 1:
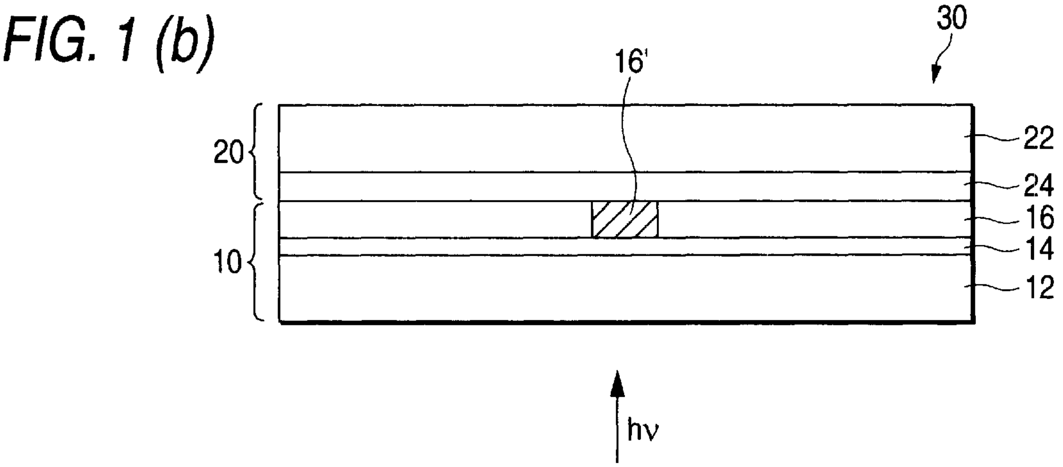
Figure 1:
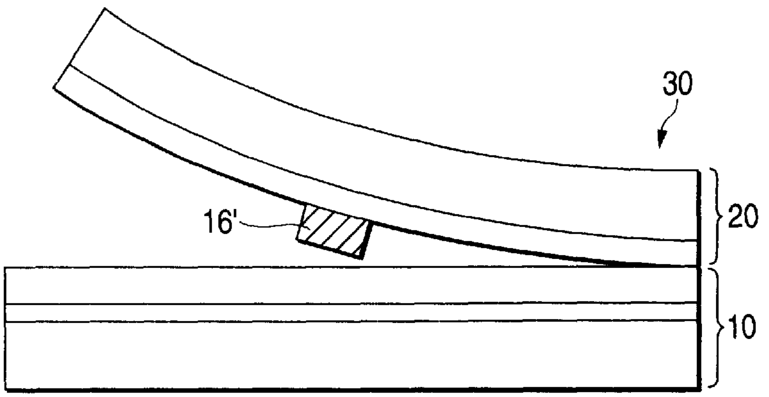

1: Recording unit
2: Recording head
3: By-scan rail
4: Recording drum
5: Heat transfer sheet-loading unit
6: Image-receiving sheet roll
7: Carrier roller
8: Squeeze roller
9: Cutter
10: Heat transfer sheet
10K, 10C, 10M, 10Y: Heat transfer sheet rolls
11: Recording media (image-receiving sheet, heat transfer sheet)
12: Support
14: Light-to-heat converting layer
16: Image-forming layer
20: Image-receiving sheet
22: Support for image-receiving sheet
24: Image-receiving layer
30: Laminate
31: Discharge table
32: Discard port
33: Discharge port
34: Air
35: Discard box
40: Adhesive roller
41: Core part
42: Adhesive member
43: Pressing controlling member
44: Cylinder (moving part)
45: Piston rod (moving part)

DETAILED DESCRIPTION OF THE INVENTION

The present invention realizes a heat transfer image by sharp dots and is effective and suitable for a system capable of transferring an image to actual printing paper and recording of B2 size (515 mm×728 mm, B2 size is 543 mm×765 mm).

The heat transfer image obtained by this system is a dot image corresponding to print line number of resolution of from 2,400 dpi to 2,540 dpi. Since individual dot obtained is very sharp and almost free of blur and chip, dots of a wide range from highlight to shadow can be clearly formed. As a result, it is possible to output dots of high grade having the same resolution as obtained by an image setter and a CTP setter, and dots and gradation which are excellent in approximation to the printed matter can be reproduced.

Since the heat transfer image obtained is sharp in dot shape, dots corresponding to laser beams can be faithfully reproduced and recording characteristics are hardly influenced by the surrounding temperature and humidity, repeating reproducibility stable in hue and density can be obtained under wide temperature and humidity conditions.

The heat transfer image obtained by this system is formed with coloring pigments used in printing inks and since excellent in repeating reproducibility, highly accurate CMS (color management system) can be realized.

Further, the heat transfer image almost coincides with the hues of Japan color and SWOP color, i.e., the hues of printed matters, and the colors appear similarly to the printed matters even when light sources of illumination are changed, such as a fluorescent lamp, an incandescent lamp.

Since the heat transfer image is sharp in dot shape, the fine line of a fine character can be reproduced sharply. Heat generated by laser beams is not diffused in the surface direction and conducted up to the transfer interface, and an image-forming layer ruptures sharply at interface of heating area/non-heating area. The thickness of the light-to-heat converting layer in the heat transfer sheet is thinned and dynamic properties of the image-forming layer are controlled for this purpose.

A light-to-heat converting layer is presumed from simulation to reach about 700° C. in a moment, and a thin layer is liable to be deformed and ruptured at that high temperature. When deformation and rupturing occur, a light-to-heat converting layer is transferred to an image-receiving sheet together with a transfer layer or a transferred image becomes uneven. On the other hand, a high concentration of light-to-heat converting materials must be present in a light-to-heat converting layer for obtaining a desired temperature, which results in a problem of precipitation or migration of the dyes to the adjacent layer.

Therefore, it is preferred to make a light-to-heat converting layer as thin as about 0.5 $\mu$m or less by selecting an infrared absorbing dye excellent in light-to-heat converting characteristics and a heat-resisting binder such as polyimide compounds.

In general, when a light-to-heat converting layer is deformed or an image-forming layer itself is deformed due to high temperature, thickness unevenness is caused in an image-forming layer transferred to an image-receiving layer corresponding to the by-scanning pattern of laser beams, as a result the image becomes uneven and apparent transfer density is reduced. The thinner the thickness of an image-forming layer, the more conspicuous is this tendency. On the other hand, when the thickness of an image-forming layer is thick, dot sharpness is impaired and sensitivity decreases.

To reconcile these reciprocal properties, it is preferred to improve transfer unevenness by adding a low melting point material to an image-forming layer, e.g., a wax. Transfer unevenness can be improved by adding inorganic fine particles in place of a binder to adjust the layer thickness of an image-forming layer properly so that the image-forming layer ruptures sharply at the interface of heating area/non-heating area while maintaining dot sharpness and sensitivity.

In general, materials having a low melting point, such as a wax, are liable to ooze to the surface of an image-forming layer or to be crystallized and cause a problem in image quality and the aging stability of a heat transfer sheet in some cases.

To cope with this problem, it is preferred to use a low melting point material having no great difference from the polymer of an image-forming layer in an SP value, by which the compatibility with the polymer can be increased and the separation of the low melting point material from the image-forming layer can be prevented. It is also preferred to mix several kinds of low melting point materials to prevent crystallization by eutectic mixture. As a result, an image showing a sharp dot shape and free of unevenness can be obtained.

Further, the dynamic properties and thermal physical properties of the coated layers of a heat transfer sheet are generally varied by absorbing moisture, thus the humidity dependency of recording condition is caused.

For reducing the temperature and humidity dependency, it is preferred that the dye/binder system of a light-to-heat converting layer and the binder system of an image-forming layer are made organic solvents. It is also preferred to use polyvinyl butyral as the binder of an image-receiving layer and to introduce a hydrophobitization technique of polymers for the purpose of lowering water absorption properties of polymers. As the hydrophobitization technique of polymers, the techniques of reacting a hydroxyl group with a hydrophobic group, or crosslinking two or more hydroxyl groups with a hardening agent as disclosed in JP-A-8-238858 can be exemplified.

About 500° C. or more heat is also generally applied to an image-forming layer by laser exposure imaging, and so some of conventionally used pigments are heat-decomposed, but this problem can be prevented by using highly heat resisting pigments in an image-forming layer.

For preventing the variation of hue due to migration of an infrared absorbing dye from a light-to-heat converting layer to an image-forming layer by high heat at exposure, it is preferred to design a light-to-heat converting layer by combination of an infrared absorbing dye having high retentivity and a binder as described above.

Shortage of energy occurs generally in high speed printing and, in particular, time lag is caused in intervals of laser by-scanning and gaps are generated. As described above, using a dye of high concentration in a light-to-heat converting layer and thinning of a light-to-heat converting layer and an image-forming layer can improve the efficiency of generation and conduction of heat. It is also preferred to add a low melting point material to an image-forming layer for the purpose of slightly fluidizing the image-forming layer at heating to thereby fill the gaps and improving the adhesion with the image-receiving layer. Further, for enhancing the adhesion of the image-receiving layer and the image-forming layer and sufficiently strengthening a transferred image, it is preferred to use the same polyvinyl butyral as used in the image-forming layer as the binder in the image-receiving layer.

It is preferred that an image-receiving sheet and a heat transfer sheet are retained on a drum by vacuum adhesion.

Since an image is formed by the adhesion control of both sheets, image transfer behavior is very sensitive to the clearance between the image-receiving layer surface in an image-receiving sheet and the image-forming layer surface in a transfer sheet, hence vacuum adhesion is important. If the clearance between the materials is widened with foreign matter, e.g., dust, as a cue, image defect and image transfer unevenness come to occur.

For preventing such image defect and image transfer unevenness, it is preferred to give uniform unevenness to a heat transfer sheet to thereby improve the air passage, to obtain uniform clearance.

For giving unevenness to a heat transfer sheet, a method of post treatment such as embossing treatment and a method of the addition of a matting agent to a coating layer are generally used, but in view of the simplification of manufacturing process and stabilization of materials with the lapse of time, the addition of a matting agent is preferred. The particle size of a matting agent must be larger than the coating layer thickness. When a matting agent is added to an image-forming layer, there arises a problem of coming out of the image of the part where the matting layer is present, accordingly, it is preferred to add a matting agent having an optimal particle size to a light-to-heat converting layer, thereby the layer thickness of an image-forming layer itself becomes almost uniform and an image free of defect can be obtained on an image-receiving sheet.

For surely reproducing sharp dots as described above, recording unit is also required to be designed highly accurately. The recording unit for use in laser-heat transfer in the present invention is the same as those conventionally used in fundamental constitution. The constitution is a so-called heat mode outer drum recording system wherein recording is performed such that recording head provided with a plurality of high power lasers irradiates laser rays on a heat transfer sheet and an image-receiving sheet fixed on a drum. Preferred embodiments are as follows.

Feeding of an image-receiving sheet and a heat transfer sheet is performed by full automatic roll feeding. Fixing of an image-receiving sheet and a heat transfer sheet on a recording drum is performed by vacuum adsorption. Many vacuum adsorption holes are formed on a recording drum, and a sheet is adsorbed by a drum by reducing the pressure in a drum with a blower or a decompression pump. Since a heat transfer sheet is further adsorbed over the adsorbed image-receiving sheet, the size of the heat transfer sheet is made larger than the size of the image-receiving sheet. The air between the heat transfer sheet and the image-receiving sheet which most affects recording performance is sucked from the area outside of the image-receiving sheet where the heat transfer sheet is alone.

In the apparatus in the present invention, a great number of sheets of a large size, such as B2, are to be accumulated on a discharge table. Therefore, a method of floating the film discharged later by blasting air between two films is used in the present invention.

Figure 2:
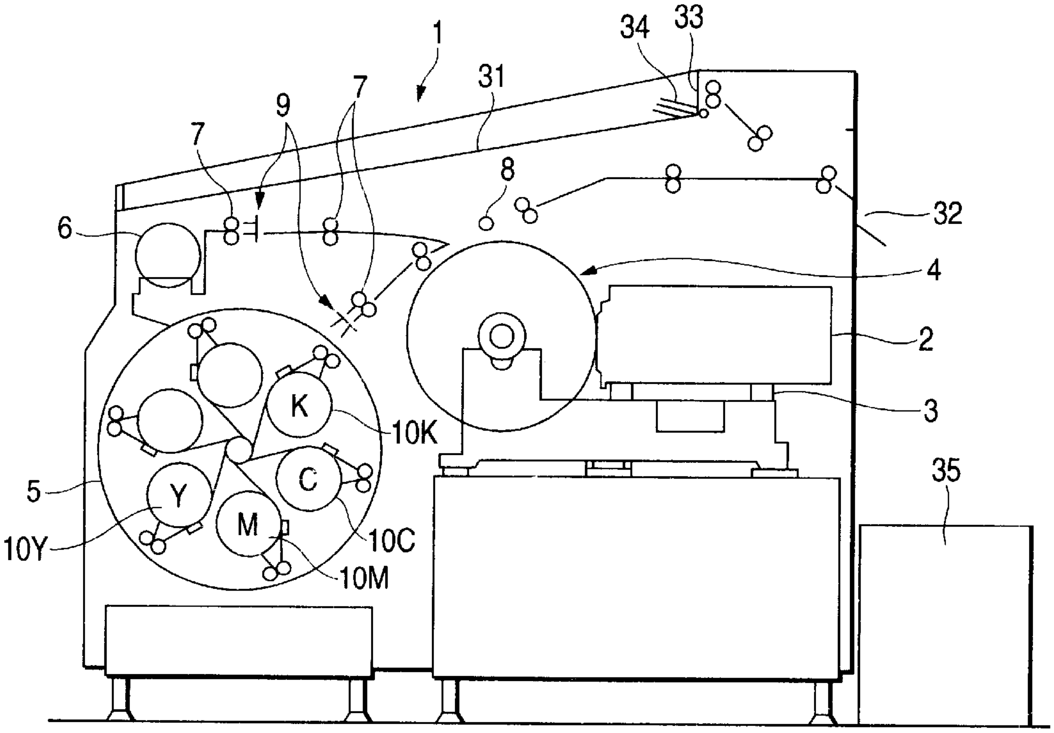
FIG. 2 is a drawing showing an example of constitution of a recording unit for laser-heat transfer.

An example of the constitution of the apparatus in the present invention is shown in FIG. 2.

The sequence of the apparatus in the present invention as above is described below.

1) By-scan axis of recording head 2 of recording unit 1 is reset by by-scan rail 3, main scan rotation axis of recording drum 4 and heat transfer sheet loading unit 5 are respectively reset at origin.
2) Image-receiving sheet roll 6 is unrolled by carrier roller 7, and the tip of the image-receiving roll is fixed on recording drum 4 by vacuum suction via suction holes provided on the recording drum.
3) Squeeze roller 8 comes down on recording drum 4 and presses the image-receiving sheet, and when the prescribed amount of the image-receiving sheet is conveyed by the rotation of the drum, the sheet is stopped and cut by cutter 9 in a prescribed length.
4) Recording drum 4 further makes a round, thus the loading of the image-receiving sheet finishes.
5) In the next place, in the same sequence as the image-receiving sheet, heat transfer sheet K of the first color, black, is drawn out from heat transfer sheet roll 10K, cut and loaded.
6) Recording drum 4 begins high speed rotation, recording head 2 on by-scan rail 3 begins to move and when reaches the starting position of recording, recording laser is irradiated on recording drum 4 by recording head 2 according to recording signals. Irradiation finishes at finishing position of recording, operation of by-scan rail and drum rotation finish. The recording head on the by-scan rail is reset.
7) Only heat transfer sheet K is peeled with the image-receiving sheet remaining on the recording drum. For the peeling, the tip of heat transfer sheet K is caught by the claw, pulled out in the discharge direction, and discarded from discard port 32 to discard box 35.

8) The procedures of 5) to 7) are repeated for the remaining three colors. Recording is performed in the order of black, cyan, magenta and yellow. That is, heat transfer sheet C of the second color, cyan, is drawn out from heat transfer sheet roll 10C, heat transfer sheet M of the third color, magenta, from heat transfer sheet roll 10M, and heat transfer sheet Y of the fourth color, yellow, from heat transfer sheet roll 10Y in order. This is the inverse of general printing order, since the order of the colors on actual paper becomes inverse by the later process of transfer to actual paper.

9) After recording of four colors, the recorded image-receiving sheet is finally discharged to discharge table 31. The peeling method from the drum is the same as that of the heat transfer sheet in above 7), but since the image-receiving sheet is not discarded unlike the heat transfer sheets, the image-receiving sheet is returned to the discharge table by switch back when conveyed to discard port 32. When the image-receiving sheet is discharged to the discharge table, air 34 is blasted from under discharge port 33 to make it possible to accumulate a plurality of sheets.

For preventing image defects due to adhesion of foreign matters such as dusts on the surfaces of the image-receiving sheet and the heat transfer sheet, cleaning by bringing an adhesive roll into contact with the surfaces is performed in the present invention.

It is sufficient that an adhesive roll should be provided at at least one of the feeding part of an image-receiving sheet and a heat transfer sheet, a carrying part and a recording part. For example, in the recording unit shown in FIG. 2, an adhesive roll may be provided at any of carrier rollers 7.

The adhesive roll for use in the present invention is of a crown shape having the difference in the diameter of the central part in the width direction of the roll body and the diameters of the positions near the ends.

Figure 3:
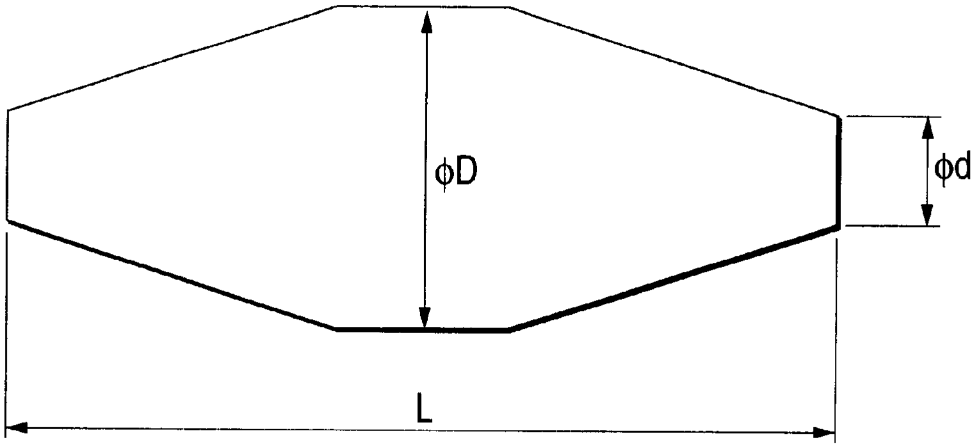
FIG. 3 is a drawing showing the conceptual figure of an adhesive roller, FIG. 3(*a*) shows a figure of taper crown, and FIG. 3(*b*) shows a figure of radial crown.
Figure 3:
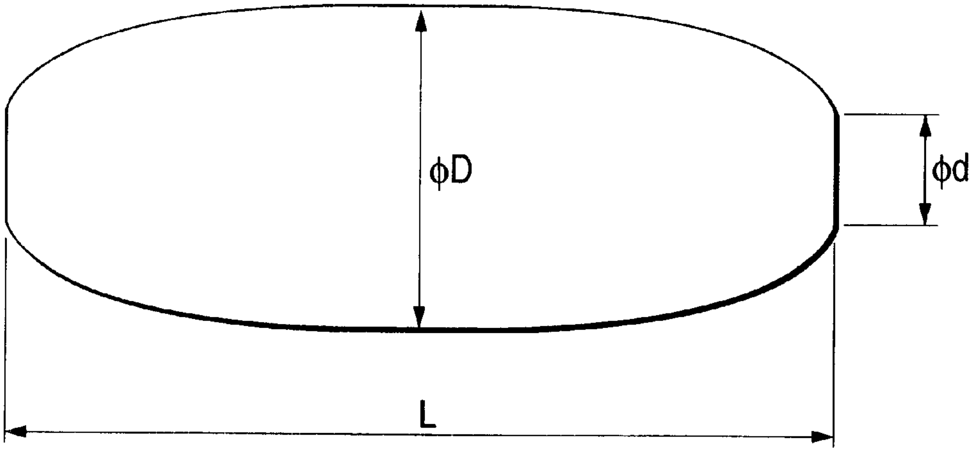

The conceptual figure of an adhesive roller is shown in FIG. 3. FIG. 3(*a*) shows a figure of taper crown having tapered planes at the ends of the width direction, and FIG. 3(*b*) shows a figure of radial crown formed in a curve over the width, and both shapes can be used in the present invention.

The adhesive roller in the present invention is formed by covering a metal core bar having supporting parts at both ends with a cylindrical rubber of a crown shape, and the specific dimensions are, for example, as follows.

The length of the roller body in the axis direction (the width of the rubber roller): 500 mm The central diameter of the rubber roller: 40 mm The end diameter of the rubber roller: 39 mm The crown shape: taper crown The supporting parts at both ends of the adhesive roller of the above type are connected with driving mechanism such as air piston, and a prescribed pressure (e.g., 98 N (10 kgf)) is applied to each supporting part by the driving mechanism. When pressure is applied to the recording medium (an image-receiving sheet and a heat transfer sheet) to be cleaned, since the adhesive roller is a crown shape, the pressure at central part in the width direction does not reduce and the pressure is applied uniformly over all the width direction. The adhesive roller is pressed against the recording medium uniformly over all the width direction by a prescribed thrust on plane due to this configuration, thereby the foreign matters on the surface of the recording medium are removed by the adhesion of the adhesive roller itself. When the adhesive roller is in contact with only one part of a recording medium, the trace of the roller is left on a part of the layer surface of the recording medium, and recording sensitivity (density) changes and leads to image failure by the presence of the trace of the roller, but the pressure is distributed uniformly and the force does not work locally by applying roller pressure uniformly in the width direction of the roller, and generations of image failure and something wrong, e.g., peeling of a film, can be prevented.

The adhesive roller of the above figure can also be used for removing foreign matters adhered on, besides the surface of a recording medium, the feeding part of a recording medium, a carrying part and a recording part by being provided on an appropriate place in a recording unit.

It is preferred to set the dimensions of the crown shape of an adhesive roller as follows. (A1) The difference in diameter between diameter D at the central position in the width direction of a roller and diameter d at the position near the end in the width direction is from 0.1 to 2 mm.

$$1.002 \leqq D/d \leqq 1.11 \qquad (A2)$$

For example, when diameter D at almost the central position is 40 mm, the diameter at both ends should be set in the range of from 36 to 39.9 mm.

$$0.0001 \leqq (D-d)/L \leqq 0.005 \qquad (A3)$$

For example, when diameter D at almost the central position is 40 mm and the length of the roller L is 500 mm, the diameter at both ends should be set in the range of from 37.5 to 39.9 mm.

By setting the dimensions in the above ranges, uniforming of the pressure by the crown shape can be particularly heightened.

As adhesive materials which are used for adhesive rollers, e.g., an ethylene-vinyl acetate copolymer, an ethylene-ethyl acrylate copolymer, a polyolefin resin, a polybutadiene resin, a styrene-butadiene copolymer (SBR), a styrene-ethylene-butene-styrene copolymer (SEBS), an acrylonitrile-butadiene copolymer (NBR), a polyisoprene resin (IR), a styrene-isoprene copolymer (SIS), an acrylic ester copolymer, a polyester resin, a polyurethane resin, an acrylate resin, a butyl rubber, and a polynorbornene can be exemplified.

Rubber materials are preferred above all, and adhesive rubbers containing $TiO_x$ (titanium oxide), and(or) hydrocarbon compounds having functional groups, e.g., C—O or Si—O, and not containing Ba (barium) can be preferably used. By containing these materials, it becomes possible to maintain the property of removing foreign matters adhered on a recording medium for a long period of time. Specifically, these materials are commercially available from Miyagawa Roller Co., Ltd., under the trade name of "Carboless MIMOSA", and graded "LT" and "ST" (refer to Table 1) are preferably used.

TABLE 1

| Grade | LT | ST |
|---|---|---|
| Adhesive Strength (hPa) | 27 | 62 |
| Hardness (°) (JIS K 6253) | 35 | 25 |
| Value of electric resistance (Ω) | $4 \times 10^7$ | $8 \times 10^7$ |

The adhesive strength, the hardness and the value of electric resistance of "Carboless MIMOSA LT" (abbreviated to "LT" in Table 1) and "Carboless MIMOSA ST" (abbreviated to "ST" in Table 1) are shown in Table 1. These adhesive rubbers also have a property of capable of removing the static electricity generated in a recording medium, since their electric resistance values are small.

Figure 4:
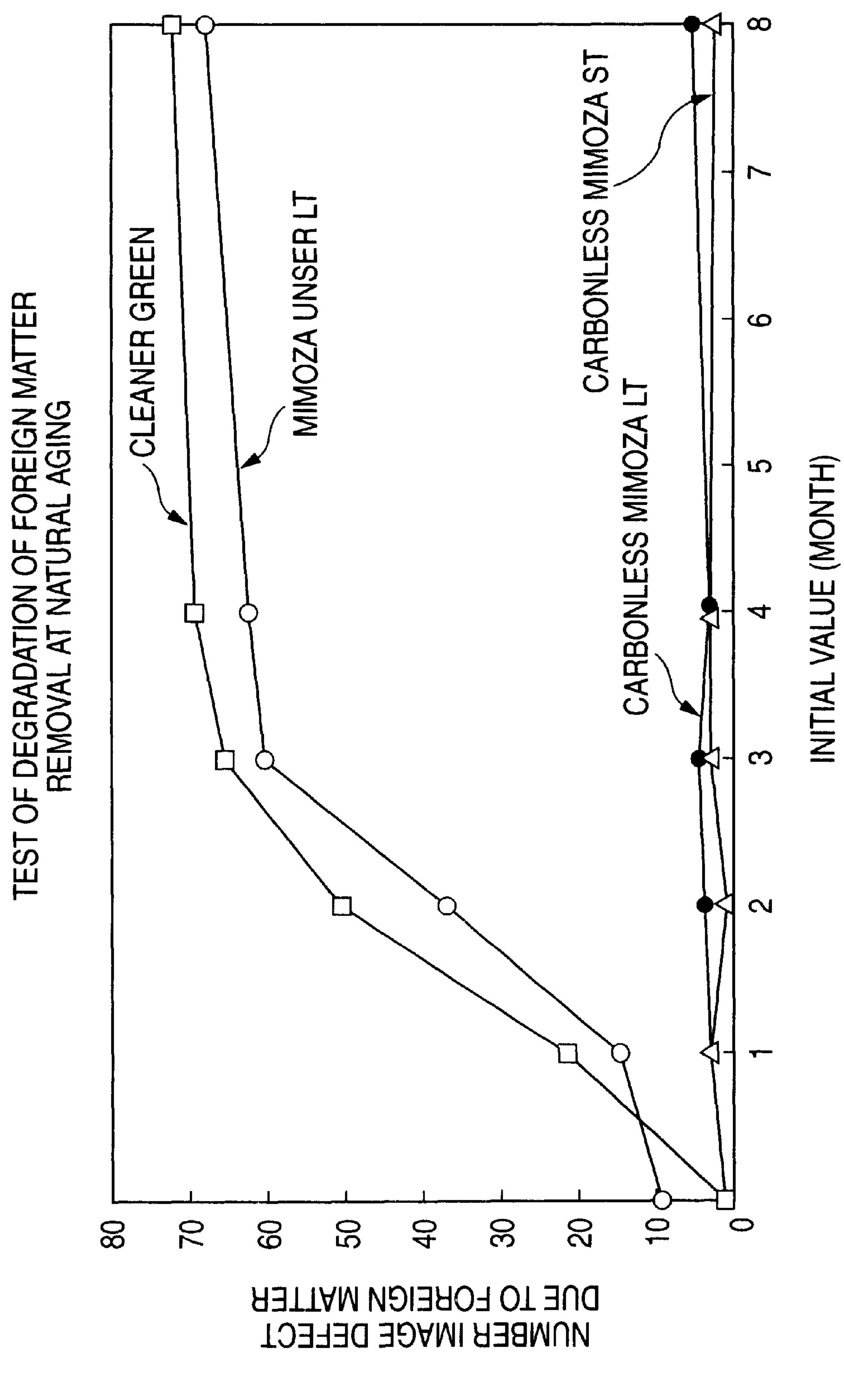
FIG. 4 is a drawing showing the results of the test of degradation of foreign matter removal due to natural aging.

The results of the test of degradation of foreign matter removal due to natural aging of four kinds of "Carboless MIMOSA LT", "Carboless MIMOSA ST", other kinds of "Cleaner Green" and "MIMOSA Under LT" are shown in FIG. 4. The graph in FIG. 4 shows the results of counting the number of image defects due to foreign matters when each roller is used after allowing to stand in the state of not using for one month. The axis of abscissa shows the number of months passed, and the axis of ordinate shows the number of image defects due to foreign matters. From the comparison, the number of image defects due to foreign matters of "Carboless MIMOSA LT" and "Carboless MIMOSA ST" was less than 10 after 8 months have passed, contrary to these, the number of image defects due to foreign matters was more than 10 (the number of image defects was 15) in the case of "MIMOSA Under LT" after 1 month has passed, 36 after two months, 60 after three months, and the image defects were almost 70 after eight months have passed. Further, in the case of "Cleaner Green", image defects due to foreign matters were already more than 20 after one month, 50 after 2 months, 67 after three months, and exceeded 70 after eight months have passed. Thus, great differences were brought about depending upon adhesive rubber materials.

Table 2 below shows the results of analyses of the rubbers materials and the comparison of comprehensive performances of "Carboless MIMOSA LT", "Carboless MIMOSA ST", "Cleaner Green" and "MIMOSA Under LT".

TABLE 2

| Example No. | Name of Adhesive Rubber | Main Polymer of Rubber | Filler | Plasticizer | Traveling Property | Property to Remove Foreign Matters | Degradation of Adhesive Strength due to Natural Aging | Adhesive Strength (Hpa) |
|---|---|---|---|---|---|---|---|---|
| Example 1 | Carboless MIMOSA ST | Isobutylene series (polymer mainly comprising isobutylene-based polymer) or Isoprene copolymer | $SiO_2$ $TiO_2$ $ZnO_2$ | Paraffin<br>Hydrocarbon-based compound, or hydrocarbon-based compound having functional groups such as C—O and Si—O | ◎ | ◎ | ◎ | 62 |
| Example 2 | Carboless MIMOSA LT | | $SiO_2$ TiO $ZnO_2$ | | ◎ | ◎ | ◎ | 27 |
| Comparative Example 1 | Cleaner Green | | $SiO_2$ $BaSO_2$ $ZnO_2$ | Paraffin | x*1 | ◎ | x | 70 |
| Comparative Example 2 | MIMOSA Under LT | — | — | — | ◎ | x*2 | x | 8 |

*1 Since the adhesive strength is too strong, the film of the image-receiving layer was peeled off, or the recording medium itself is sometimes turned up.
*2 Since the adhesive strength is too weak, foreign matters cannot be removed sufficiently.

It can be understood that adhesive rubber materials such as "Carboless MIMOSA LT" and "Carboless MIMOSA ST" containing $TiO_x$ as a filler and a hydrocarbon compound having a functional group, e.g., C—O or Si—O, as a plasticizer are superior in traveling property and slow in the degradation of adhesive strength due to natural aging, therefore, they are preferably used as the roller in the embodiment of the present invention. Contrary to this, adhesive rubbers containing Ba are inferior in traveling property and the degradation of adhesive strength due to natural aging. From these facts, it can be seen that adhesive rubbers containing Ba are not suited for removing foreign matters in a recording unit.

Accordingly, the component which constitutes the adhesive rubber applicable to the adhesive roller for use in the present invention is any of the following (B1) to (B5), i.e., the adhesive rubber which:

(B1) contains $TiO_x$, (B2) contains $TiO_x$, and does not contain Ba, (B3) contains a hydrocarbon compound having a functional group, e.g., C—O or Si—O, (B4) contains $TiO_x$ and a hydrocarbon compound having a functional group, e.g., C—O or Si—O, (B5) contains $TiO_x$, and a hydrocarbon compound having a functional group, e.g., C—O or Si—O, and does not contain Ba.

By the adhesive roller constituted of the adhesive material consisting of the above component, foreign matters adhered to the objective face of foreign matter removal can be removed and the image defects of recorded images can be prevented for a long period of time.

Vickers hardness Hv of the material having viscosity used in the adhesive roller is preferably 50 $kg/mm^2$ (=about 490 MPa) or less in view of capable of sufficiently removing foreign matters and suppressing image defect.

Vickers hardness is the hardness obtained by measurement with applying static load to a pyramid indenter of diamond having the angle between the opposite faces of 136°, and Vickers hardness Hv can be obtained by the following equation:

$$\text{Hardness Hv}=1.854\ P/d^2\ (kg/mm^2)=\text{about } 18.1692\ P/d^2\ (\text{Mpa})$$

wherein P: load (kg), d: the length of diagonal line of the square of depressed area (mm).

It is also preferred in the present invention that the modulus of elasticity at 20° C. of the material having viscosity used in the adhesive roller is 200 $kg/cm^2$ (=about 19.6 MPa) or less in view of capable of sufficiently removing foreign matters and suppressing image defect similarly to the above.

For preventing the adhesive roller from being excessively pressed against the objective face of foreign matter removal, it is preferred to provide pressing controlling members made of a harder material than the material of the adhesive member at both ends of the adhesive roller.

Figure 5:
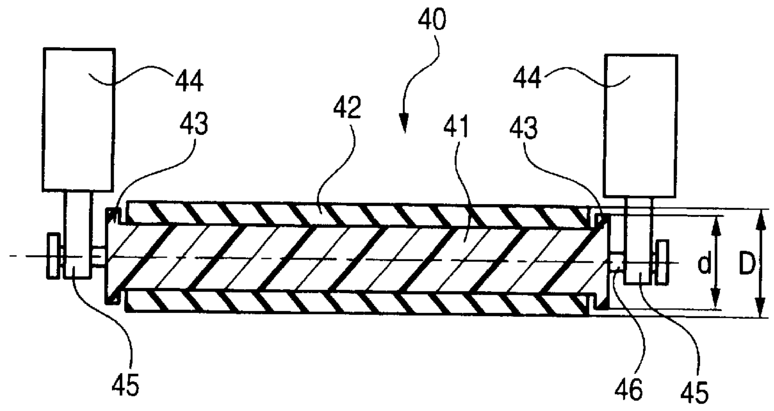
FIG. 5 is a drawing showing an adhesive roller before being pressed against an objective face of foreign matter removal, FIG. 5(*a*) is a cross-sectional view, and FIG. 5(*b*) is a side view.
Figure 5:
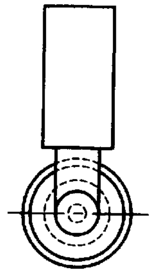

FIG. 5 is a drawing showing an adhesive roller before being pressed against an objective face of foreign matter removal, FIG. 5(*a*) is a cross-sectional view of the adhesive roller, and FIG. 5(*b*) is a side view of the adhesive roller.

The adhesive roller shown in FIG. 5(*a*) is constituted such that the cylindrical core part 41 is formed with the axis of rotation as center and adhesive member 42 is installed so as to cover around core part 41.

At both ends of the axis of rotation direction of adhesive roller 40 comprised of core part 41 and adhesive member 42, a pair of pressing controlling members 43, 43, a pair of air cylinders 44, 44, and a pair of piston rods 45, 45 are arranged.

The adhesive roller is of a crown shape and has diameter d at near the end part in the width direction of the roller, pressing controlling members 43 has diameter $d_c$, and the roller is designed so that diameter $d_c$ of pressing controlling members 43 is slightly smaller than diameter d of near the end part in the width direction of the roller. Accordingly, the value obtained by [the radius of the roller (d/2)]–[the radius of the pressing controlling members ($d_c/2$)] is the deformed amount by compression of adhesive member 42 when adhesive roller 40 is pressed against the objective face of foreign matter removal.

When air is supplied to air cylinders 44, 44 from air supplying source not shown in the Figure, piston rods 45, 45 are extended and moving action begins so as to press adhesive roller 40 against the objective face of foreign matter removal. When moving action begins, adhesive member 42 having a larger diameter than the controlling disc is brought into contact with the objective face of foreign matter removal in the first place, then adhesive member 42 is gradually deformed by compression with the extension of piston rods 45, 45, and then pressing controlling members 43, 43 are brought into contact with the objective face of foreign matter removal, thereby deformation by compression of adhesive member 42 is controlled.

Figure 6:
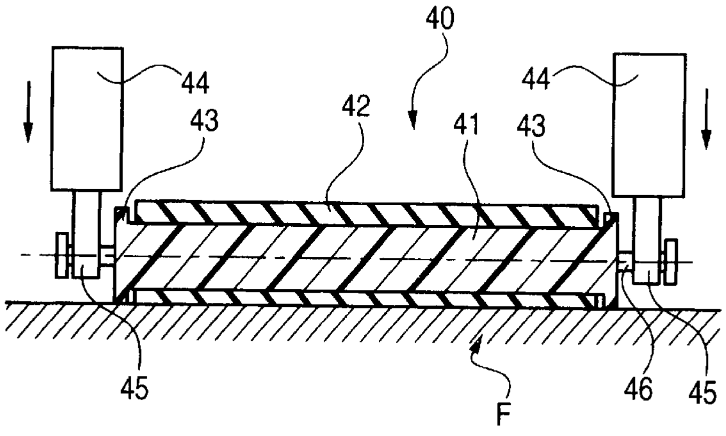
FIG. 6 is a drawing showing an adhesive roller after being pressed against an objective face of foreign matter removal, FIG. 6(*a*) is a cross-sectional view, and FIG. 6(*b*) is a side view.
Figure 6:
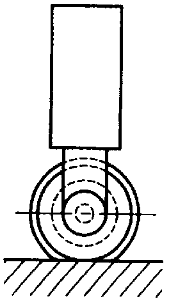

FIG. 6 is a drawing showing an adhesive roller after being pressed against an objective face of foreign matter removal, FIG. 6(*a*) is a cross-sectional view of the adhesive roller, and FIG. 6(*b*) is a side view of the adhesive roller.

After the deformation by compression of adhesive member 42 is controlled by bringing pressing controlling members 43, 43 into contact with objective face F of foreign matter removal, the foreign matters on objective face F of foreign matter removal are removed by adhesive member 42 deformed by compression. At this time, the radius from the center of the rotation axis of adhesive roller 40 to the outer surface of adhesive member 42 compression-deformed by the compression-deformed amount $\alpha$ ($d/2-\alpha$) and the radius of the controlling disc ($d_c/2$) become the same. After foreign matter-removing work of objective face F of foreign matter removal by adhesive roller 40 finishes, piston rods 45, 45 are contracted, adhesive roller 40 separates from objective face F of foreign matter removal, and compression-deformed adhesive member 42 expands and restores the original radius.

For effecting good foreign matter removal by the adhesive roller according to the present invention, the difference in the outer diameter of an adhesive member d and the diameter of a pressing controlling member $d_c$ is related as shown in Table 3 below.

TABLE 3

| $d-d_c$ (mm) | In the case where the objective face of foreign matter removal is an image-receiving sheet or a heat transfer sheet | In the case where the objective face of foreign matter removal is a rotary drum for recording or a recording medium face-fixing member (plate) |
|---|---|---|
| 0 | foreign matter removal was not good | foreign matter removal was not good |
| 0.5 | foreign matter removal was good | foreign matter removal was good |
| 1 | foreign matter removal was very good | foreign matter removal was very good |
| 2 | foreign matter removal was very good | foreign matter removal was very good |
| 2.5 | the sheet was partially turned up or the film was peeled off | rotation resistance of the drum slightly increased or the plate deviated from position |
| 3 | the sheet was turned up or the film was peeled off | rotation resistance of the drum increased or the plate came off |

As can be seen from Table 1, when $d-d_c$ is 0 i. e., the outer diameter of an adhesive member and the diameter of a pressing controlling member are the same, the adhesive member of the adhesive roller cannot be deformed by compression, therefore, adhesion-removal of foreign matters is hardly done on the objective face of foreign matter removal, which results in foreign matter removal failure. When transfer is performed on this condition, image defects such as clear spots and ring-like unevenness occur due to the presence of foreign matters.

On the other hand, when the diameter of a pressing controlling member is smaller than the outer diameter of an adhesive member by 0.5 to 2 mm, an excellent foreign matter-removing effect can be obtained, since the adhesive member is deformed by compression and closely adheres to the object of foreign matter removal. If the diameter of a pressing controlling member is smaller than the outer diameter of an adhesive member by 2.5 to 3 mm, the compression-deformed amount (adhesion amount) of the adhesive member to the objective face of foreign matter removal becomes too great to cause peeling off of the image-receiving layer in an image-receiving sheet, partial peeling off of the image-forming layer in a heat transfer sheet, and increase in bending of the rotation axis of the adhesive roller. Further, in the case where the objective face of foreign matter removal is a recording medium face-fixing member (plate) for fixing the sheet laid on a rotary drum for recording, the surface of a rotary drum for recording, or the opposite roller, since the pressing force of the adhesive member is too strong and the rotation resistance of the drum increases, normal rotational motion is hindered.

In the next place, a preferred procedure of cleaning recording media (an image-receiving sheet and a heat transfer sheet) fixed on a recording medium-fixing member, e.g., a recording drum, is described with reference to FIGS. 7 and 8.

Figure 7:
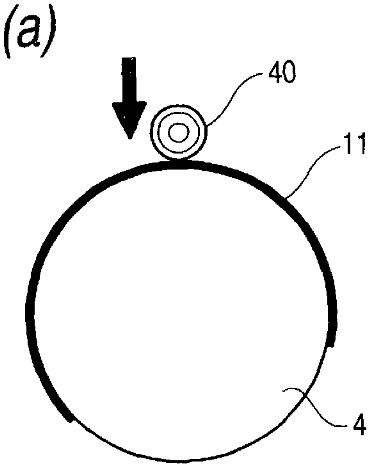
FIGS. 7(*a*) to 7(*f*) are drawings showing the relationship between a recording medium and an adhesive roller mounted on a recording drum.
Figure 7:
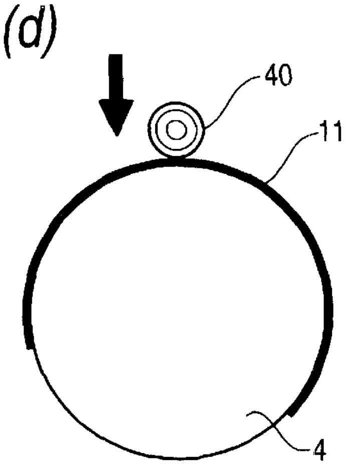
Figure 7:
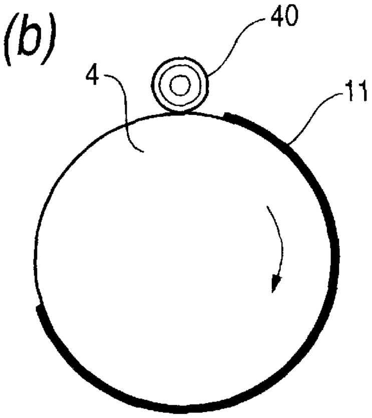
Figure 7:
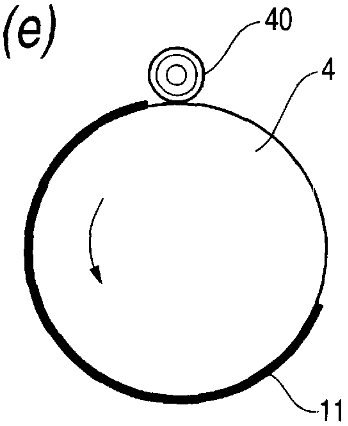
Figure 7:
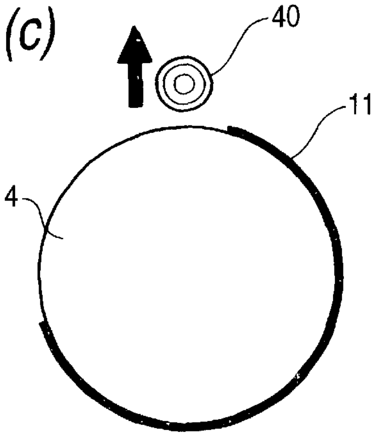
Figure 7:
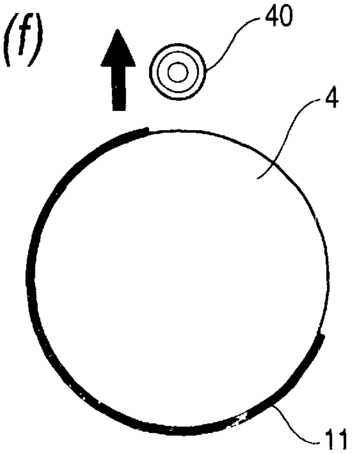
Figure 8:
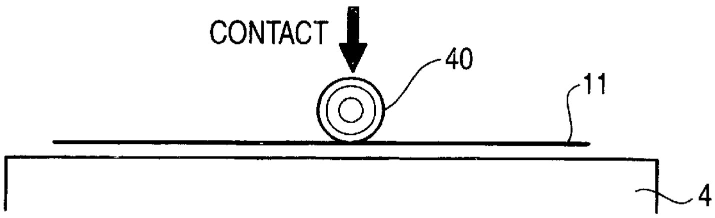
FIGS. 8(*a*) to 8(*f*) are drawings showing the relationship between a recording medium and an adhesive roller by developing the circumferential plane of a recording drum.
Figure 8:
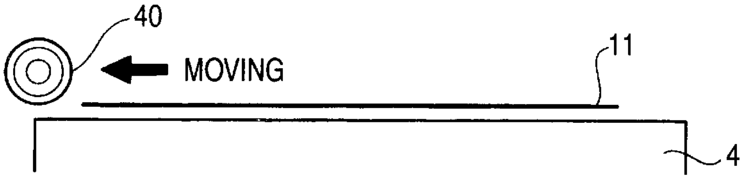
Figure 8:
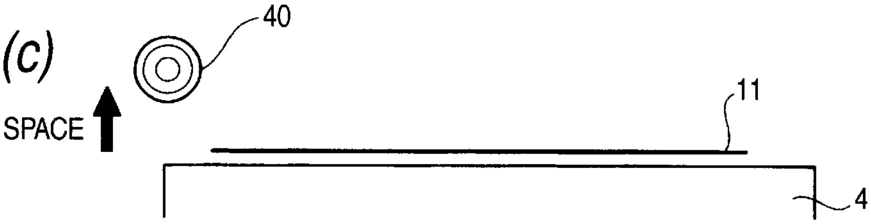
Figure 8:
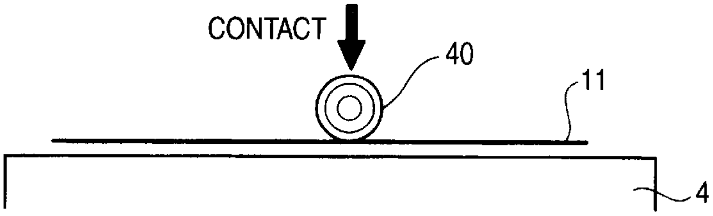
Figure 8:
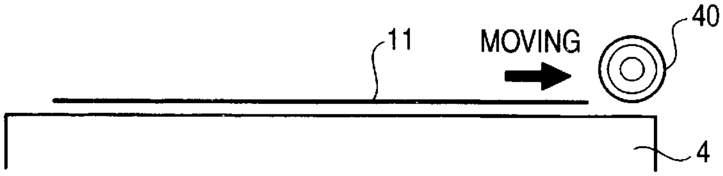
Figure 8:
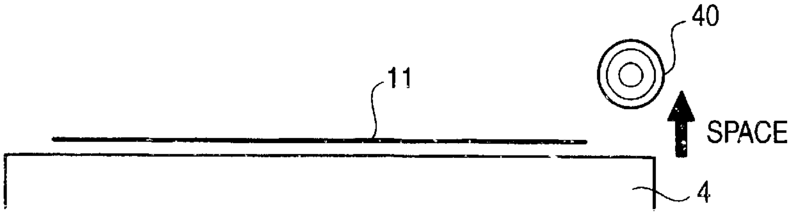

FIG. 7 is a drawing showing the relationship between a recording medium and an adhesive roller mounted on a recording drum, and FIG. 8 is a drawing showing the relationship between a recording medium and an adhesive roller by developing the circumferential plane of a recording drum.

In the first place, as shown in FIG. 7(*a*) and FIG. 8(*a*), adhesive roller 40 is brought into contact with recording medium 11 fixed on recording drum 4 at almost the central part in the circumferential direction (the relative moving direction to adhesive roller 40), and recording drum 4 is rotated by driving as shown in FIG. 7(*b*) and FIG. 8(*b*) (in the clockwise direction as an example here). Then, as shown in FIG. 7(*c*) and FIG. 8(*c*), adhesive roller 40 is separated from the surface of recording medium 11 almost vertically after adhesive roller 40 has passed one end in the circumferential direction of recording medium 11. By the above operation, cleaning of the region from the central part in the circumferential direction where adhesive roller 40 is brought into contact with recording medium 11 first to one end in the circumferential direction is performed.

In the next place, as shown in FIG. 7(*d*) and FIG. 8(*d*), adhesive roller 40 is again brought into contact with recording medium 11 fixed on recording drum 4 at almost the central part in the circumferential direction, and recording drum 4 is rotated by driving in the reverse direction of the last time as shown in FIG. 7(*e*) and FIG. 8(*e*) (in the counterclockwise direction). Then, as shown in FIG. 7(*f*) and FIG. 8(*f*), adhesive roller 40 is separated from the surface of recording medium 11 almost vertically after adhesive roller 40 has passed the other end in the circumferential direction of recording medium 11. By the above operation, cleaning of the region from the central part in the circumferential direction where adhesive roller 40 is brought into contact with recording medium 11 in the second place to the other end in the circumferential direction is performed, thus the entire surface of the recording medium is to be cleaned.

The position where adhesive roller 40 is brought into contact with recording medium 11 is preferably set as follows.

Figure 9:
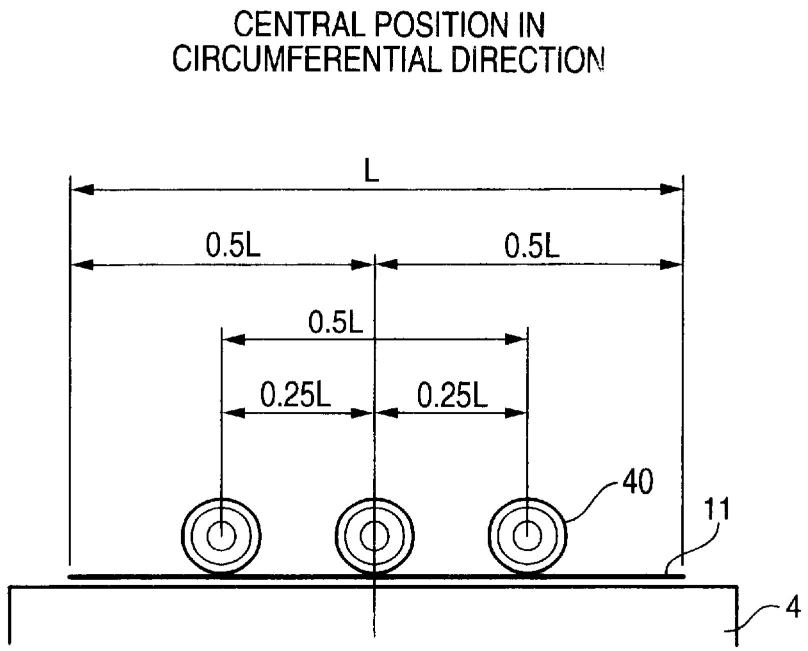
FIG. 9 is a drawing showing the starting position of an adhesive roller of coming into contact with a recording medium on the circumferential plane of a recording drum.

The starting position of an adhesive roller of coming into contact with a recording medium on the circumferential plane of a recording drum is shown in FIG. 9. As shown in FIG. 9, when the length of in the circumferential direction of recording medium 11 is taken as L, the central position of recording medium 11 in the circumferential direction is the position of 0.5L from the end of the circumferential direction of recording medium 11. The starting position of an adhesive roller of coming into contact with a recording medium on the circumferential plane of a recording drum is preferably the range of ±0.25L in the circumferential direction from the central position in the circumferential direction, i.e., the range of 50% of the circumferential length with the central position in the circumferential direction as the center. By beginning contacting within this range, a sufficient distance from the end of the circumferential direction of recording medium 11 can be kept, cleaning range per one time can be widened and effective cleaning can be performed.

Figure 10:
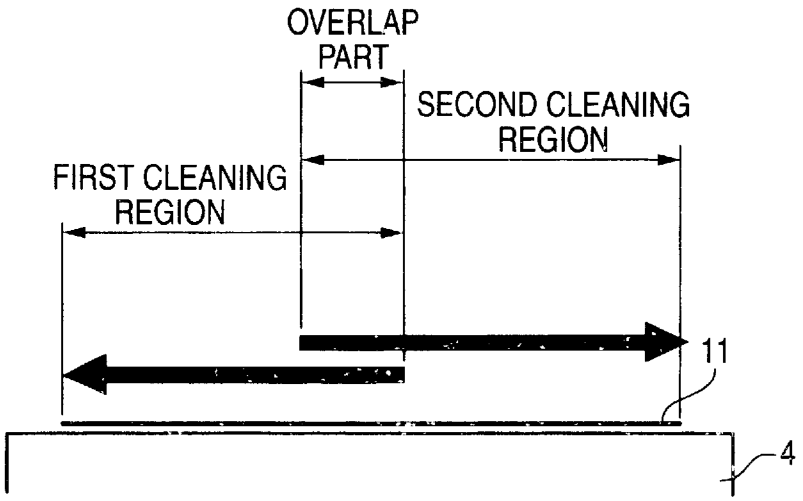
FIG. 10 is a drawing showing the state that the cleaning area of a recording medium in the circumferential direction of one end and the cleaning area in the circumferential direction of another end overlap.

The state of the first cleaning area of recording medium 11 to one end in the circumferential direction overlapping the second cleaning area to another end in the circumferential direction is shown in FIG. 10. As is shown in FIG. 10, the entire surface of recording medium 11 can be cleaned leaving no space by overlapping the cleaning areas in both directions. It is preferred to set 45% or less of the length in circumferential direction of a recording medium as the overlapping amount, by which cleaning can be performed by overlapping surely even if errors are generated in the rotary position of a recording drum or in the fixing position of a recording medium, further, useless cleaning can be prevented by excess overlapping.

According to the above cleaning method of recording medium 11, recording medium 11 can be prevented from turning up from the surface of recording drum 4, recording medium 11 can be prevented from deviating from the position, film peeling off can be prevented from occurring, and recording medium 11 can be prevented from coming off recording drum 4. When an image-receiving sheet is subjected to cleaning with adhesive roller 40, the foreign matters adhered on the image-receiving layer of the image-receiving sheet are removed, which prevents image blank spots from occurring, and when a heat transfer sheet on an image-receiving sheet is subjected to cleaning, the foreign matters on the support of the heat transfer sheet are removed, which prevents laser beams irradiated at recording from being interrupted, thus generation of image blank spots can be inhibited.

The cleaning method of a recording medium has been described taking a recording unit of a rotary drum type of recording by fixing a recording medium on recording drum 4 as an example, but the present invention is not limited thereto, for example, the above cleaning method of a recording medium is also applicable to a fixing type recording unit of performing recording by fixing a recording medium taking recording drum 4 whose circumferential plane is developed shown in FIG. 8 as a planar fixing platform, and to a carrying type recording unit of performing recording while carrying a recording medium with nip rollers. That is, recording unit may be any constitution so long as the adhesive roller can be moved relatively to a recording medium-fixing member such as a recording drum or a planar fixing platform.

It is preferred that the absolute value of the difference between the surface roughness Rz of the front face of the image-forming layer in the heat transfer sheet and the surface roughness Rz of the back face of the image-forming layer is 3.0 or less, and the absolute value of the difference between the surface roughness Rz of the front face of the image-receiving layer in the image-receiving sheet and the surface roughness Rz of the back face of the image-receiving layer is 3.0 or less. By such constitution of the present invention, conjointly with the above cleaning means, image defect can be prevented, jamming in carrying can be done away with, and dot gain stability can be improved.

The surface roughness Rz in the present invention means ten point average surface roughness corresponding to Rz of JIS B 0601 (maximum height). The surface roughness is obtained by inputting and computing the distance between the average value of the altitudes of from the highest peak to the fifth peak and the average value of the depths of from the deepest valley to the fifth valley with the average surface of the part obtained by removing by the reference area from the curved surface of roughness as the reference level. A feeler type three dimensional roughness meter (Surfcom 570A-3DF, manufactured by Tokyo Seimitsu Co., Ltd.) is used in measurement. The measurement is performed in machine direction, the cutoff value is 0.08 mm, the measured area is 0.6 mm×0.4 mm, the feed pitch is 0.005 mm, and the speed of measurement is 0.12 mm/sec.

For further improving the above effects, it is preferred that the absolute value of the difference between the surface roughness Rz of the front surface of the image-forming layer in the heat transfer sheet and the surface roughness Rz of the back surface of the image-forming layer is 1.0 or less.

Further, as another embodiment, it is preferred that the surface roughness Rz of the front surface and the back surface of the heat transfer sheet is from 2 to 30 $\mu$m. By such constitution conjointly with the above cleaning means, image defect can be prevented, jamming in carrying can be done away with, and dot gain stability can be improved.

It is also preferred that the glossiness of the image-forming layer in the heat transfer sheet is from 80 to 99.

The glossiness largely depends upon the surface smoothness of the image-forming layer and can affect the uniformity of the layer thickness of the image-forming layer. When the glossiness is higher, the image-forming layer becomes more uniform and more preferred for highly accurate use, but when the smoothness is high, the resistance at conveying becomes larger, thus they are in relationship of trade off. When the glossiness is from 80 to 99, both are compatible and well-balanced.

The scheme of multicolor image-forming by membrane heat transfer using a laser is outlined with referring to FIG. 1.

Laminate 30 for image formation comprising image-receiving sheet 20 laminated on the surface of image-forming layer 16 containing pigment black (K), cyan (C), magenta (M) or yellow (Y) in heat transfer sheet 10 is prepared. Heat transfer sheet 10 comprises support 12, having provided thereon light-to-heat converting layer 14 and further thereon image-forming layer 16, and image-receiving sheet 20 comprises support 22 and having provided thereon image-receiving layer 24, and image-receiving layer 24 is laminated on the surface of image-forming layer 16 in heat transfer sheet 10 in contact therewith (FIG. 1(*a*)). When laser beams are irradiated imagewise in time series from the side of support 12 in heat transfer sheet 10 of laminate 30, the irradiated area with laser beams of light-to-heat converting layer 14 in heat transfer sheet 10 generates heat, thereby the adhesion with image-forming layer 16 is reduced (FIG. 1(*b*)). Thereafter, when image-receiving sheet 20 and heat transfer sheet 10 are peeled off, the area irradiated with laser beams 16' of image-forming layer 16 is transferred to image-receiving layer 24 in image-receiving sheet 20 (FIG. 1(*c*)).

In multicolor image formation, the laser beam for use in irradiation preferably comprises multi-beams, particularly preferably comprises multi-beams of two-dimensional array. Multi-beams of two-dimensional array means that a plurality of laser beams are used when recording by irradiation with laser beam is performed, and the spot array of these laser beams comprises two-dimensional array comprised of a plurality of rows along the main scanning direction and a plurality of rows along the by-scanning direction.

The time required in laser recording can be shortened by using multi-beams of two-dimensional array.

Any laser beam can be used in recording with no limitation so long as it is comprised of multi-beams, such as gas laser beams, e.g., an argon ion laser beam, a helium neon laser beam, and a helium cadmium laser beam, solid state laser beams, e.g., a YAG laser beam, and direct laser beams, e.g., a semiconductor laser beam, a dye laser beam and an excimer laser beam, can be used. Alternatively, laser beams obtained by converting these laser beams to half the wavelength through secondary harmonic generation elements can also be used. In multicolor image formation, semiconductor laser beams are preferably used taking the output power and easiness of modulation into consideration. In multicolor image formation, it is preferred that laser beam emission is performed on conditions that the beam diameter of laser beam on the light-to-heat converting layer is from 5 to 50 μm (in particular from 6 to 30 μm), and scanning speed is preferably 1 m/second or more (particularly preferably 3 m/second or more).

In addition, it is preferred in multicolor image formation that the layer thickness of the image-forming layer in the black heat transfer sheet is larger than the layer thickness of the image-forming layer in each of yellow, magenta and cyan heat transfer sheets, and is preferably from 0.5 to 0.7 μm. By adopting this constitution, the reduction of density due to transfer unevenness by the irradiation of the black heat transfer sheet with laser beams can be suppressed.

When the layer thickness of the image-forming layer in the black heat transfer sheet is less than 0.5 μm, image density is reduced due to transfer unevenness by high energy recording, thus it is difficult in some cases to obtain required image density as the proof of printing. Since this tendency becomes more conspicuous under high humidity conditions, density variation due to surrounding conditions sometimes becomes too great. On the other hand, when the layer thickness is more than 0.7 μm, transfer sensitivity is reduced at recording time by laser and impression of small dots and fine lines is sometimes deteriorated. This tendency becomes more conspicuous under low humidity conditions. Resolution often lowers when the layer thickness of the image-forming layer is not within the above range. The layer thickness of the image-forming layer in the black heat transfer sheet is more preferably from 0.55 to 0.65 μm and particularly preferably 0.60 μm.

Further, it is preferred that the layer thickness of the image-forming layer in the above black heat transfer sheet is from 0.5 to 0.7 μm, and the layer thickness of the image-forming layer in each of the above yellow, magenta and cyan heat transfer sheets is from 0.2 to less than 0.5 μm.

When the layer thickness of each image-forming layer in yellow, magenta and cyan heat transfer sheets is less than 0.2 μm, image density is liable to lower due to transfer unevenness when recording is performed by laser irradiation. On the other hand, when the layer thickness is 0.5 μm or more, the reduction of transfer sensitivity and the deterioration of resolution are sometimes caused. The layer thickness of each image-forming layer in yellow, magenta and cyan heat transfer sheets is more preferably from 0.3 to 0.45 μm.

It is preferred for the image-forming layer in the black heat transfer sheet to contain carbon black, and the carbon black preferably comprises at least two carbon blacks having different tinting strength from the viewpoint of capable of controlling reflection density with maintaining P/B (pigment/binder) ratio in a specific range.

The tinting strength of carbon black can be represented variously, e.g., PVC blackness disclosed in JP-A-10-140033, can be exemplified. PVC blackness is the evaluation of blackness, i.e., carbon black is added to PVC resin, dispersed by a twin roll mill and made to a sheet, and the blackness of a sample is evaluated by visual judgement, with taking the blackness of Carbon Black#40 and #45 (manufactured by Mitsubishi Chemicals Co., Ltd.) as 1 point and 10 points respectively as the standard values. Two or more carbon blacks having different PVC blacknesses can be used arbitrarily according to purposes.

The specific producing method of a sample is described below.

Producing Method of Sample

In a banbury mixer having a capacity of 250 ml, 40 mass % (i.e., by weight %) of sample carbon black is compounded to LDPE (low density polyethylene) resin and kneaded at 115° C. for 4 minutes.

Compounding Condition

| | |
|---|---|
| LDPE resin | 101.89 g |
| Calcium stearate | 1.39 g |
| Irganox ® 1010 | 0.87 g |
| Sample carbon black | 69.43 g |

In the next place, dilution is performed in a twin roll mill at 120° C. so as to reach the concentration of carbon black of 1 mass %.

Preparation Condition of Diluted Compound

| | |
|---|---|
| LDPE resin | 58.3 g |
| Calcium stearate | 0.2 g |
| Resin compounded with 40 mass % of carbon black | 1.5 g |

The above-prepared product is made to a sheet having a slit width of 0.3 mm, the sheet is cut to chips, and a film having a thickness of 65±3 $\mu$m is formed on a hot plate at 240° C.

A multicolor image may be formed, as described above, by the method of using the heat transfer sheet, and repeatedly superposing many image layers (an image-forming layer on which an image is formed) on the same image-receiving sheet, alternatively a multicolor image may be formed by the method of forming images on a plurality of image-receiving sheets once, and then transferring these images to an actual paper (i.e., a printing paper).

With the latter case, for example, heat transfer sheets having image-forming layers each containing a coloring material mutually different in hue are prepared, and independently four kinds (cyan, magenta, yellow, black) of laminates for image-forming each comprising the above heat transfer sheet combined with an image-receiving sheet are produced. Laser irradiation according to digital signal on the basis of the image is performed to each laminate through a color separation filter, subsequently the heat transfer sheet and the image-receiving sheet are peeled off, to thereby form independently a color-separated image of each color on each image-receiving sheet. Thereafter, the thus-formed each color-separated image is laminated in sequence on an actual support, such as (actual) printing paper prepared separately, or on a support approximates thereto, thus a multicolor image can be formed.

Heat transfer recording which utilizes laser beam irradiation is not particularly restricted with respect to pigments and dyes at the time of transferring, and the change of state of an image-forming layer, including a solid state, a softened state, a liquid state and a gas state, preferably a solid state and a softened state, so long as the heat transfer recording is capable of converting laser beams to heat and transferring an image-forming layer containing a pigment on an image-receiving sheet using the above converted heat energy and forming an image on the image-receiving sheet. Conventionally well-known fusion transfer, ablation transfer and sublimation transfer also belong to the heat transfer recording utilizing laser beam irradiation.

The above-described membrane transfer, fusion transfer and ablation transfer are preferred in point of capable of forming an image of a hue analogous to a printed matter.

Further, a heat laminator is generally used in the process for transferring an image-receiving sheet printed with an image in printing unit to a printing paper (referred to as "actual paper"). An image-receiving sheet and an actual paper are superposed and heat and pressure are applied, thereby the image-receiving sheet and the actual paper are adhered, and then the image-receiving sheet is peeled off the actual paper, as a result only the image-receiving sheet having an image is left on the actual paper.

By connection the above unit with a plate-making system, a system capable of exhibiting the function as color proof is constructed. As the system, it is necessary that a printed matter having an image quality approximating as far as possible to the printed matter outputted from certain plate-making data must be outputted from the printing unit. Therefore, a software for approximating dots and colors to a printed matter is necessary. The specific example of connection is described below.

When the proof of a printed matter is obtained from a plate-making system (e.g., Celebra™, manufactured by Fuji Photo Film Co., Ltd.), the system connection is as follows. CTP (computer to plate) system is connected with the plate-making system. The final printed matter can be obtained by mounting the printing plate outputted from this system on a printing machine. As a color proof, the above recording unit is connected with the plate-making system, and as proof drive software for approximating dots and colors to the printed matter, PD system (registered trademark) is connected with the plate-making system.

Contone data (continuous tone data) converted to raster data by the plate-making system are converted to binary data for dots and outputted to CTP system and finally subjected to printing. On the other hand, the same contone data are also outputted to PD system. PD system converts the received data according to four dimensional (black, cyan, magenta and yellow) table so that the colors coincide with the printed matter, and finally converts to binary data for dots so that the dots coincide with the dots of the printed matter and the data is outputted to the recording unit.

The four dimensional table is experimentally prepared in advance and saved in the system. The experiment for the preparation of the four dimensional table is as follows. The printed image of important color data via CTP system and the outputted image of important color data from the recording unit via PD system are prepared, the measured color values of these images are compared and the table is formed so that the difference becomes minimum.

A heat transfer sheet and an image-receiving sheet which are preferably used in the recording unit of the above system are described below.

Heat Transfer Sheet

A heat transfer sheet comprises a support having thereon at least a light-to-heat converting layer and an image-receiving layer, and, if necessary, other layers.

Support

The materials of the support of the heat transfer sheet are not particularly restricted, and various supports can be used according to purposes. The support preferably has stiffness, good dimensional stability, and heat resistance capable of resisting the heat at image formation. The preferred examples of the support include synthetic resins, e.g., polyethylene terephthalate, polyethylene-2,6-naphthalate, polycarbonate, polymethyl methacrylate, polyethylene, polypropylene, polyvinyl chloride, polyvinylidene chloride, polystyrene, a styrene-acrylonitrile copolymer, polyamide (aromatic and aliphatic), polyimide, polyamideimide, and polysulfone. Biaxially stretched polyethylene terephthalate is preferred above all from the viewpoint of mechanical strength and dimensional stability against heat. When resins are used in the preparation of color proofs utilizing laser recording, it is preferred to form the support of a heat transfer sheet from transparent synthetic resins which transmit laser beams. The thickness of the support is preferably from 25 to 130 $\mu$m, particularly preferably from 50 to 120 $\mu$m. The central line average surface roughness Ra of the support of the side on which an image-forming layer is provided is preferably less than 0.1 $\mu$m (the value obtained by measurement using Surfcom, manufactured by Tokyo Seiki Co., Ltd., according to JIS B0601). The Young's modulus of the support in the machine direction is preferably from 200 to 1,200 $kg/mm^2$ (=about 2 to 12 GPa), and the Young's modulus of the support in the transverse direction is preferably from 250 to 1,600 $kg/mm^2$ (=about 2.5 to 16 GPa). The F-5 value of the support in the machine direction is preferably from 5 to 50 $kg/mm^2$ (=about 49 to 490 MPa), and the F-5 value of the support in the transverse direction is preferably from 3 to 30 $kg/mm^2$ (=about 29.4 to 294 MPa), and the F-5 value of the support in the machine direction is generally higher than the F-5 value of the support in the transverse direction, but when it is necessary to make the strength particularly in the transverse direction high, this rule does not apply to the case. Further, the heat shrinkage rate at 100° C. for 30 minutes of the support in the machine direction and the transverse direction is preferably 3% or less, more preferably 1.5% or less, the heat shrinkage rate at 80° C. for 30 minutes is preferably 1% or less, more preferably 0.5% or less. The breaking strength is from 5 to 100 $kg/mm^2$ (=about 49 to 980 MPa) in both directions, and the modulus of elasticity is preferably from 100 to 2,000 $kg/mm^2$ (=about 0.98 to 19.6 GPa).

The support of the heat transfer sheet may be subjected to surface activation treatment and/or one or two or more undercoat layers may be provided on the support for the purpose of improving the adhesion with the light-to-heat converting layer which is provided on the support. As the examples of the surface activation treatments, glow discharge treatment and corona discharge treatment can be exemplified. As the materials of the undercoat layer, materials having high adhering property to both surfaces of the support and the light-to-heat converting layer, low heat conductivity, and excellent heat resisting property are preferably used. As the materials of such an undercoat layer, styrene, a styrene-butadiene copolymer and gelatin can be exemplified. The thickness of the undercoat layer is generally from 0.01 to 2 $\mu$m as a whole. If necessary, various functional layers such as a reflection-preventing layer and an antistatic layer may be provided on the surface of the heat transfer sheet of the side opposite to the side on which a light-to-heat converting layer is provided, or the support may be subjected to various surface treatments.

Backing Layer

It is preferred to provide a backing layer on the surface of the heat transfer sheet of the side opposite to the side on which a light-to-heat converting layer is provided. The backing layer preferably comprises the first backing layer contiguous to the support and the second backing layer provided on the side of the support opposite to the side on which the first backing layer is provided. In the present invention, the mass A of the antistatic agent contained in the first backing layer to the mass B of the antistatic agent contained in the second backing layer, B/A, is preferably less than 0.3. When B/A is 0.3 or higher, a sliding property and powder dropout resistance of the backing layer are liable to be deteriorated.

The layer thickness C of the first backing layer is preferably from 0.01 to 1 $\mu$m, more preferably from 0.01 to 0.2 $\mu$m. The layer thickness D of the second backing layer is preferably from 0.01 to 1 $\mu$m, more preferably from 0.01 to 0.2 $\mu$m. The ratio of the layer thickness of the first backing layer to that of the second backing layer, C/D, is preferably from 1/2 to 5/1.

As the antistatic agents for use in the first and second backing layers, a nonionic surfactant, e.g., polyoxyethylene alkylamine, and glycerol fatty acid ester; a cationic surfactant, e.g., a quaternary ammonium salt; an anionic surfactant, e.g., alkylphosphate; an ampholytic surfactant and electrically conductive resin can be used.

Electrically conductive fine particles can also be used as antistatic agents. The examples of such electrically conductive fine particles include oxides, e.g., $ZnO$, $TiO_2$, $SnO_2$, $Al_2O_3$, $In_2O_3$, $MgO$, $BaO$, $CoO$, $CuO$, $Cu_2O$, $CaO$, $SrO$, $BaO_2$, $PbO$, $PbO_2$, $MnO_3$, $MoO_3$, $SiO_2$, $ZrO_2$, $Ag_2O$, $Y_2O_3$, $Bi_2O_3$, $Ti_2O_3$, $Sb_2O_5$, $K_2Ti_6O_{13}$, $NaCaP_2O_{18}$ and $MgB_2O_5$; sulfide, e.g., $CuS$ and $ZnS$; carbide, e.g., $SiC$, $TiC$, $ZrC$, $VC$, $NbC$, $MoC$ and $WC$; nitride, e.g., $Si_3N_4$, $TiN$, $ZrN$, $VN$, $NbN$ and $Cr_2N$; boride, e.g., $TiB_2$, $ZrB_2$, $NbB_2$, $TaB_2$, $CrB$, $MoB$, $WB$ and $LaB_5$; silicide, e.g., $TiSi_2$, $ZrSi_2$, $NbSi_2$, $TaSi_2$, $CrSi_2$, $MoSi_2$ and $WSi_2$; metal salts, e.g., $BaCO_3$, $CaCO_3$, $SrCO_3$, $BaSO_4$ and $CaSO_4$; and composite, e.g., $SiN_4$—$SiC$ and $9Al_2O_3$-$2B_2O_3$. These electrically conductive fine particles may be used alone or in combination of two or more. Of these fine particles, $SnO_2$, $ZnO$, $Al_2O_3$, $TiO_2$, $In_2O_3$, $MgO$, $BaO$ and $MoO_3$ are preferred, $SnO_2$, $ZnO$, $In_2O_3$ and $TiO_2$ are more preferred, and $SnO_2$ is particularly preferred.

When the heat transfer sheet in the present invention is used in a laser-heat transfer system, the antistatic agent used in the backing layer is preferably substantially transparent so that laser beams can be transmitted.

When electrically conductive metallic oxides are used as the antistatic agent, their particle size is preferably smaller to make light scattering as small as possible, but the particle size should be determined using the ratio of the refractive indices of the particles and the binder as parameter, which can be obtained according to the theory of Mie. The average particle size of the electrically conductive metallic oxides is generally from 0.001 to 0.5 $\mu$m, preferably from 0.003 to 0.2 $\mu$m. The average particle size used herein is the value of the particle size of not only the primary particles of the electrically conductive metallic oxides but the particle size of the particles having the hkl structure is included.

Besides an antistatic agent, the first and second backing layers may contain various additives, such as a surfactant, a sliding agent and a matting agent, and a binder. The amount of the antistatic agent contained in the first backing layer is preferably from 10 to 1,000 mass parts (i.e., weight parts) per 100 mass parts of the binder, more preferably from 200 to 800 mass parts. The amount of the antistatic agent contained in the second backing layer is preferably from 0 to 300 mass parts per 100 mass parts of the binder, more preferably from 0 to 100 mass parts.

As the binders for use for forming the first and second backing layers, homopolymers and copolymers of acrylic acid-based monomers, e.g., acrylic acid, methacrylic acid, acrylic ester and methacrylic ester, cellulose-based polymers, e.g., nitrocellulose, methyl cellulose, ethyl cellulose and cellulose acetate, vinyl-based polymers and copolymers of vinyl compounds, e.g., polyethylene, polypropylene, polystyrene, vinyl chloride-based copolymer, vinyl chloride-vinyl acetate copolymer, polyvinyl pyrrolidone, polyvinyl butyral and polyvinyl alcohol, condensed polymers, e.g., polyester, polyurethane and polyamide, rubber-based thermoplastic polymers, e. g., butadiene-styrene copolymer, polymers obtained by polymerization or crosslinking of photopolymerizable or heat polymerizable compounds, e.g., epoxy compounds, and melamine compounds can be exemplified.

Light-to-heat Converting Layer

A light-to-heat converting layer may contain a light-to-heat converting material, a binder, a matting agent and other additives, if necessary.

A light-to-heat converting material is a material having a function of converting irradiated light energy to heat energy. A light-to-heat converting material is in general a dye (inclusive of a pigment, hereinafter the same) capable of absorbing a laser beam. When image-recording is performed by infrared laser, it is preferred to use an infrared absorbing dye as the light-to-heat converting material. As the examples of the dyes, black pigments, e.g., carbon black, pigments of macrocyclic compounds having absorption in the visible region to the near infrared region, e.g., phthalocyanine and naphthalocyanine, organic dyes which are used as the laser-absorbing material in high density laser recording such as photo-disc, e.g., a cyanine dye such as an indolenine dye, an anthraquinone dye, an azulene dye and a phthalocyanine dye, and organic metallic compound dyes, e.g., dithiol nickel complex, can be exemplified. Of the above compounds, cyanine dyes are particularly preferably used, since they show a high absorption coefficient to the lights in the infrared region, and the thickness of a light-to-heat converting layer can be thinned when used as the light-to-heat converting material, as a result, the recording sensitivity of a heat transfer sheet can be further improved.

As the light-to-heat converting material, particulate metallic materials such as blackened silver and inorganic materials can also be used besides dyes.

As the binder to be contained in the light-to-heat converting layer, resins having at least the strength capable of forming a layer on a support and preferably having high heat conductivity are preferred. Heat resisting resins which are not decomposed by heat generated from the light-to-heat converting material at image recording are preferably used as the binder resin, since the surface smoothness of the light-to-heat converting layer can be maintained after irradiation even when light irradiation is performed with high energy. Specifically, resins having heat decomposition temperature (the temperature at which the mass decreases by 5% in air current at temperature increasing velocity of 10° C./min by TGA method (thermal mass spectrometry)) of 400° C. or more are preferably used, more preferably 500° C. or more. Binders preferably have glass transition temperature of from 200 to 400° C., more preferably from 250 to 350° C. When the glass transition temperature is lower than 200° C., there is a case where fog is generated on the image to be formed, while when it is higher than 400° C., the solubility of the resin is decreased, followed by the reduction of the productivity in some cases.

Further, the heat resistance (e.g., heat deformation temperature and heat decomposition temperature) of the binder in the light-to-heat converting layer is preferably higher than the heat resistance of the materials used in other layers provided on the light-to-heat converting layer.

Specifically, acrylate resins, e.g., polymethyl methacrylate, vinyl resins, e.g., polycarbonate, polystyrene, vinyl chloride/vinyl acetate copolymer and polyvinyl alcohol, polyvinyl butyral, polyester, polyvinyl chloride, polyamide, polyimide, polyether imide, polysulfone, polyether sulfone, aramid, polyurethane, epoxy resin and urea/melamine resin are exemplified as the binder resins for use in the light-to-heat converting layer. Of these resins, polyimide resin is preferred.

Polyimide resins represented by the following formulae (I) to (VII) are soluble in an organic solvent and the productivity of the heat transfer sheet is improved when they are used. Further, these polymide resins are preferred in view of capable of improving the stability of viscosity, long term storage stability and moisture resistance of the coating solution for the light-to-heat converting layer.

(I)

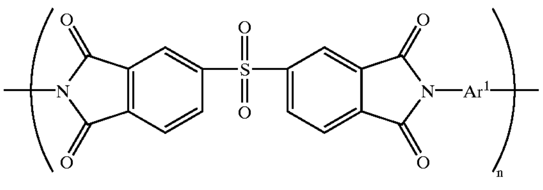

(II)

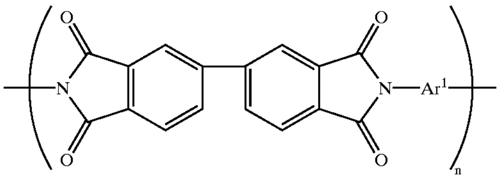

In formulae (I) and (II), $Ar^1$ represents an aromatic group represented by the following formula (1), (2) or (3), and n represents an integer of from 10 to 100.

(1)

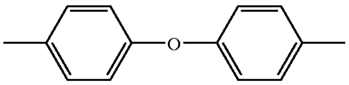

(2)

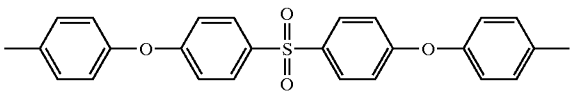

(3)

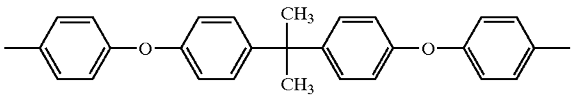

(III)

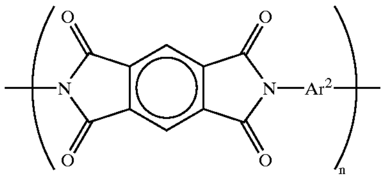

(IV)

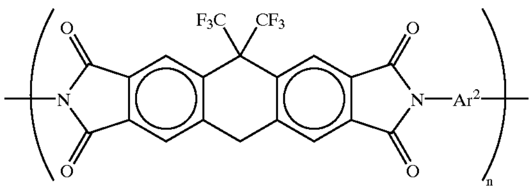

In formulae (III) and (IV), $Ar^2$ represents an aromatic group represented by the following formula (4), (5), (6) or (7), and n represents an integer of from 10 to 100.

(4)

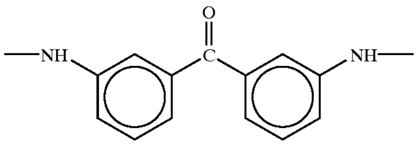

(5)

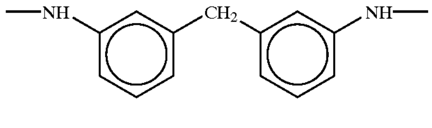

(6)

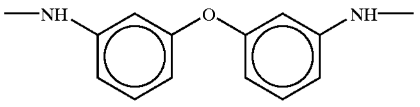

(7)

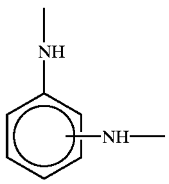

(V)

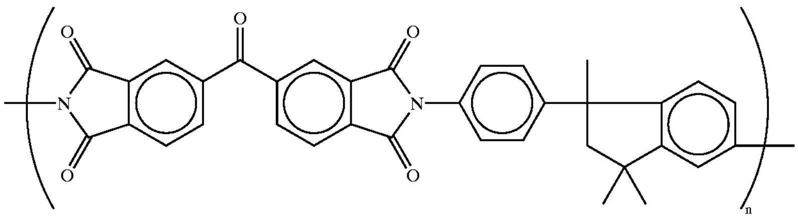

(VI)

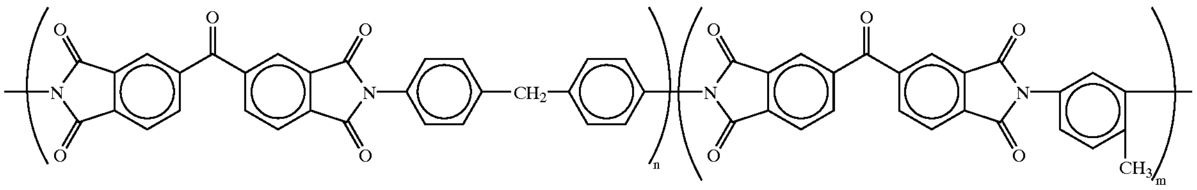

(VII)

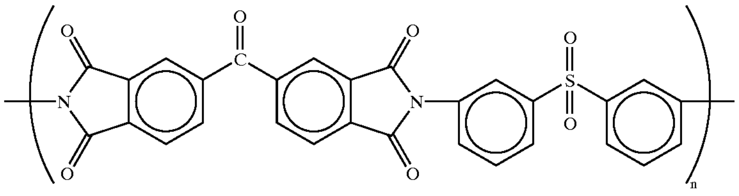

In formulae (V), (VI) and (VII), n and m each represents an integer of from 10 to 100. In formula (VI), the ratio of n/m is from 6/4 to 9/1.

As the criterion whether a resin is soluble in an organic solvent or not, when 10 mass parts (i.e., weight parts) or more of the resin is dissolved in 100 mass parts of N-methylpyrrolidone at 25° C., the resin can be preferably used in the light-to-heat converting layer, more preferably 100 mass parts is dissolved in 100 mass parts of N-methylpyrrolidone.

As the matting agent contained in the light-to-heat converting layer, inorganic and organic fine particles can be exemplified. The examples of the inorganic fine particles include metal salts, e.g., silica, titanium oxide, aluminum oxide, zinc oxide, magnesium oxide, barium sulfate, magnesium sulfate, aluminum hydroxide, magnesium hydroxide and boron nitride, kaolin, clay, talc, zinc flower, lead white, zeeklite, quartz, diatomaceous earth, pearlite, bentonite, mica and synthetic mica. The examples of the organic fine particles include resin particles, e.g., fluorine resin particles, guanamine resin particles, acrylic resin particles, styrene/acryl copolymer resin particles, silicone resin particles, melamine resin particles and epoxy resin particles.

The matting agents generally have a particle size of from 0.3 to 30 $\mu$m, preferably from 0.5 to 20 $\mu$m, and the addition amount is preferably from 0.1 to 100 mg/$M^2$.

The light-to-heat converting layer may further contain a surfactant, a thickener, and an antistatic agent, if necessary.

The light-to-heat converting layer can be provided by dissolving a light-to-heat converting material and a binder, adding, if necessary, a matting agent and other components thereto to thereby prepare a coating solution, and coating the coating solution on a support and drying. As the organic solvents for dissolving polyimide resins, e.g., n-hexane, cyclohexane, diglyme, xylene, toluene, ethyl acetate, tetrahydrofuran, methyl ethyl ketone, acetone, cyclohexanone, 1,4-dioxane, 1,3-dioxane, dimethyl acetate, N-methyl-2-pyrrolidone, dimethyl sulfoxide, dimethylformamide, dimethylacetamide, γ-butyrolactone, ethanol and methanol can be exemplified. Coating and drying can be performed according to ordinary coating and drying methods. Drying is generally performed at 300° C. or less, preferably 200° C. or less. When polyethylene terephthalate is used as the support, the drying temperature is preferably from 80 to 150° C.

If the amount of the binder in the light-to-heat converting layer is not sufficient, the cohesive strength of the light-to-heat converting layer lowers and the light-to-heat converting layer is liable to be transferred together when an image formed is transferred to an image-receiving sheet, which causes color mixture. While when the amount of the polyimide resin is too much, the layer thickness of the light-to-heat converting layer becomes too large to achieve a definite absorptivity, thereby sensitivity is liable to be decreased. The mass ratio (i.e., weight ratio) of the solid content of the light-to-heat converting material to the binder in the light-to-heat converting layer is preferably 1/20 to 2/1, particularly preferably 1/10 to 2/1.

As described above, when the layer thickness of the light-to-heat converting layer is thinned, the sensitivity of the heat transfer sheet is increased and so preferred. The layer thickness of the light-to-heat converting layer is preferably from 0.03 to 1.0 $\mu$m, more preferably from 0.05 to 0.5 $\mu$m. Further, when the light-to-heat converting layer has the optical density of from 0.80 to 1.26 to the beam having wavelength of 808 nm, the transfer sensitivity of the image-forming layer is improved, more preferably the optical density is from 0.92 to 1.15 to the beam having wavelength of 808 nm. When the optical density at wavelength of 808 nm is less than 0.80, irradiated light cannot be sufficiently converted to heat and sometimes transfer sensitivity is reduced. Contrary to this, when it exceeds 1.26, the function of the light-to-heat converting layer at recording is affected and sometimes fog is generated.

Image-forming Layer

An image-forming layer contains at least a pigment which is transferred to an image-receiving sheet and forms an image, in addition, a binder for forming the layer and, if necessary, other components.

Pigments are broadly classified to organic pigments and inorganic pigments, and they have respectively characteristics such that the former are particularly excellent in the transparency of the film, and the latter are excellent in shielding property, thus they may be used arbitrarily according to purposes. When the heat transfer sheet is used for the proofs of printing colors, organic pigments which are coincident with yellow, magenta, cyan and black generally used in printing ink or near to them in tone are preferably used. Further, metallic powder and fluorescent pigments are also used in some cases. The examples of the pigments which are preferably used include azo pigments, phthalocyanine pigments, anthraquinone pigments, dioxazine pigments, quinacridone pigments, isoindolinone pigments and nitro pigments. The pigments for use in an image-forming layer are listed below by hues, but the present invention is not limited thereto.

1) Yellow Pigment

Pigment Yellow 12 (C.I. No. 21090)

Example:

Permanent Yellow DHG (manufactured by Clariant Japan, K.K.), Lionol Yellow 1212B (manufactured by Toyo Ink Mfg. Co., Ltd.), Irgalite Yellow LCT (manufactured by Ciba Specialty Chemicals), Symuler Fast Yellow GTF 219 (manufactured by Dai-Nippon Ink & Chemicals Inc.)

Pigment Yellow 13 (C.I. No. 21100)

Example:

Permanent Yellow GR (manufactured by Clariant Japan, K.K.), Lionol Yellow 1313 (manufactured by Toyo Ink Mfg. Co., Ltd.)

Pigment Yellow 14 (C.I. No. 21095)

Example:

Permanent Yellow G (manufactured by Clariant Japan, K.K.), Lionol Yellow 1401-G (manufactured by Toyo Ink Mfg. Co., Ltd.), Seika Fast Yellow 2270 (manufactured by Dainichi Seika K.K.), Symuler Fast Yellow 4400 (manufactured by Dai-Nippon Ink & Chemicals Inc.)

Pigment Yellow 17 (C.I. No. 21105)

Example:

Permanent Yellow GG02 (manufactured by Clariant Japan, K.K.), Symuler Fast Yellow 8GF (manufactured by Dai-Nippon Ink & Chemicals Inc.)

Pigment Yellow 155

Example:

Graphtol Yellow 3GP (manufactured by Clariant Japan, K.K.)

Pigment Yellow 180 (C.I. No. 21290)

Example:

Novoperm Yellow P-HG (manufactured by Clariant Japan, K.K.),

PV Fast Yellow HG (manufactured by Clariant Japan, K.K.)

Pigment Yellow 139 (C.I. No. 56298)

Example:

Novoperm Yellow M2R 70 (manufactured by Clariant Japan, K.K.)

2) Magenta pigment

Pigment Red 57:1 (C.I. No. 15850:1)

Example:

Graphtol Rubine L6B (manufactured by Clariant Japan, K.K.), Lionol Red 6B-4290G (manufactured by Toyo Ink Mfg. Co., Ltd.), Irgalite Rubine 4BL (manufactured by Ciba Specialty Chemicals), Symuler Brilliant Carmine 6B-229 (manufactured by Dai-Nippon Ink & Chemicals Inc.)

Pigment Red 122 (C.I. No. 73915)

Example:

Hosterperm Pink E (manufactured by Clariant Japan, K.K.), Lionogen Magenta 5790 (manufactured by Toyo Ink Mfg. Co., Ltd.), Fastogen Super Magenta RH (manufactured by Dai-Nippon Ink & Chemicals Inc.)

Pigment Red 53:1 (C.I. No. 15585:1)

Example:

Permanent Lake Red LCY (manufactured by Clariant Japan, K.K.), Symuler Lake Red C conc (manufactured by Dai-Nippon Ink & Chemicals Inc.)

Pigment Red 48:1 (C.I. No. 15865:1)

Example:

Lionol Red 2B-3300 (manufactured by Toyo Ink Mfg. Co., Ltd.), Symuler Red NRY (manufactured by Dai-Nippon Ink & Chemicals Inc.)

Pigment Red 48:2 (C.I. No. 15865:2)

Example:

Permanent Red W2T (manufactured by Clariant Japan, K.K.), Lionol Red LX235 (manufactured by Toyo Ink Mfg. Co., Ltd.), Symuler Red 3012 (manufactured by Dai-Nippon Ink & Chemicals Inc.)

Pigment Red 48:3 (C.I. No. 15865:3)

Example:

Permanent Red 3RL (manufactured by Clariant Japan, K.K.), Symuler Red 2BS (manufactured by Dai-Nippon Ink & Chemicals Inc.)

Pigment Red 177 (C.I. No. 65300)

Example:

Cromophtal Red A2B (manufactured by Ciba Specialty Chemicals)

3) Cyan Pigment

Pigment Blue 15 (C.I. No. 74160)

Example:

Lionol Blue 7027 (manufactured by Toyo Ink Mfg. Co., Ltd.), Fastogen Blue BB (manufactured by Dai-Nippon Ink & Chemicals Inc.)

Pigment Blue 15:1 (C.I. No. 74160)

Example:

Hosterperm Blue A2R (manufactured by Clariant Japan, K.K.), Fastogen Blue 5050 (manufactured by Dai-Nippon Ink & Chemicals Inc.)

Pigment Blue 15:2 (C.I. No. 74160)

Example:

Hosterperm Blue AFL (manufactured by Clariant Japan, K.K.), Irgalite Blue BSP (manufactured by Ciba Specialty Chemicals), Fastogen Blue GP (manufactured by Dai-Nippon Ink & Chemicals Inc.)

Pigment Blue 15:3 (C.I. No. 74160)

Example:

Hosterperm Blue B2G (manufactured by Clariant Japan, K.K.), Lionol Blue FG7330 (manufactured by Toyo Ink Mfg. Co., Ltd.), Cromophtal Blue 4GNP (manufactured by Ciba Specialty Chemicals), Fastogen Blue FGF (manufactured by Dai-Nippon Ink & Chemicals Inc.)

Pigment Blue 15:4 (C.I. No. 74160)

Example:

Hosterperm Blue BFL (manufactured by Clariant Japan, K.K.), Cyanine Blue 700-10FG (manufactured by Toyo Ink Mfg. Co., Ltd.), Irgalite Blue GLNF (manufactured by Ciba Specialty Chemicals), Fastogen Blue FGS (manufactured by Dai-Nippon Ink & Chemicals Inc.)

Pigment Blue 15:6 (C.I. No. 74160)

Example:

Lionol Blue ES (manufactured by Toyo Ink Mfg. Co., Ltd.)

Pigment Blue 60 (C.I. No. 69800)

Example:

Hosterperm Blue RL01 (manufactured by Clariant Japan, K.K.), Lionogen Blue 6501 (manufactured by Toyo Ink Mfg. Co., Ltd.)

4) Black Pigment

Pigment Black 7 (carbon black C.I. No. 77266)

Example:

Mitsubishi Carbon Black MA100 (manufactured by Mitsubishi Chemicals Co., Ltd.), Mitsubishi Carbon Black #5 (manufactured by Mitsubishi Chemicals Co., Ltd.), Black Pearls 430 (manufactured by Cabot Co.)

As the pigments which can be used in the present invention, commercially available products can be arbitrarily selected by referring to *Ganryo Binran* (*Pigment Handbook*), compiled by Nippon Ganryo Gijutsu Kyokai, published by Seibundo-Shinko-Sha (1989), and *COLOUR INDEX, THE SOCIETY OF DYES& COLOURIST*, Third Ed. (1987).

The average particle size of the above pigments is preferably from 0.03 to 1 $\mu$m, more preferably from 0.05 to 0.5 $\mu$m.

When the particle size is less than 0.03 $\mu$m, the costs for dispersion are increased and the dispersion solution cause gelation, while when it is more than 1 $\mu$m, since coarse particles are contained in pigments, good adhesion of the image-forming layer and the image-receiving layer can not be obtained, further, the transparency of the image-forming layer is inhibited.

As the binders for the image-forming layer, amorphous organic high polymers having a softening point of from 40 to 150° C. are preferably used. As the amorphous organic high polymers, homopolymers and copolymers of styrene, derivatives thereof, and substitution products thereof, e.g., butyral resin, polyamide resin, polyethyleneimine resin, sulfonamide resin, polyester polyol resin, petroleum resin, styrene, vinyltoluene, $\alpha$-methylstyrene, 2-methylstyrene, chlorostyrene, vinylbenzoic acid, sodium vinylbenzenesulfonate, and aminostyrene, methacrylic esters and methacrylic acid, e.g., methyl methacrylate, ethyl methacrylate, butyl methacrylate, and hydroxyethyl methacrylate, acrylic esters and acrylic acid, e.g., methyl acrylate, ethyl acrylate, butyl acrylate, and $\alpha$-ethylhexyl acrylate, dienes, e.g., butadiene and isoprene, homopolymers of vinyl monomers or copolymers of vinyl monomers with other monomers, e.g., acrylonitrile, vinyl ethers, maleic acid and maleic esters, maleic anhydride, cinnamic acid, vinyl chloride and vinyl acetate can be used. Two or more of these resins may be used as mixture.

It is preferred for the image-forming layer to contain a pigment in an amount of from 30 to 70 mass % (i.e., weight %), more preferably from 30 to 50 mass %. It is also preferred for the image-forming layer to contain resins in an amount of from 30 to 70 mass %, more preferably from 40 to 70 mass %.

The image-forming layer can contain the following components (1) to (3) as the above-described other components.

(1) Waxes

The examples of waxes include mineral waxes, natural waxes and synthetic waxes. As the examples of the mineral waxes, petroleum wax such as paraffin wax, microcrystalline wax, ester wax and oxide wax, montan wax, ozokerite and ceresin can be exemplified. Paraffin wax is preferred above all. The paraffin wax is separated from petroleum, and various products are commercially available according to melting points.

As the examples of the natural waxes, vegetable wax, e.g., carnauba wax, Japan wax, ouriculy wax and esparto wax, and animal wax, e.g., beeswax, insect wax, shellac wax and spermaceti can be exemplified.

The synthetic waxes are generally used as a lubricant and generally comprises higher fatty acid compounds. As the examples of the synthetic waxes, the following can be exemplified.

1) Fatty Acid-based Wax

A straight chain saturated fatty acid represented by the following formula:

$$CH_3(CH_2)_nCOOH$$

In the formula, n represents an integer of from 6 to 28. As the specific examples, stearic acid, behenic acid, palmitic acid, 12-hydroxystearic acid, and azelaic acid can be exemplified.

In addition, the metal salts of the above fatty acids (e.g., with K, Ca, Zn and Mg) can be exemplified.

2) Fatty Acid Ester-based Wax

As the examples of the fatty acid esters, ethyl stearate, lauryl stearate, ethyl behenate, hexyl behenate and behenyl myristate can be exemplified.

3) Fatty Acid Amide-based Wax

As the examples of the fatty acid amides, stearic acid amide and lauric acid amide can be exemplified.

4) Aliphatic Alcohol-based Wax

A straight chain saturated aliphatic alcohol represented by the following formula:

$CH_3(CH_2)_nOH$

In the formula, n represents an integer of from 6 to 28. As the specific examples, stearyl alcohol can be exemplified.

Of the above synthetic waxes 1) to 4), higher fatty acid amides such as stearic acid amide and lauric acid amide are preferred. Further, these wax compounds can be used alone or in arbitrary combination, as desired.

(2) Plasticizers

As the plasticizers, ester compounds are preferred, and well-known plasticizers can be exemplified, such as phthalic esters, e.g., dibutyl phthalate, di-n-octyl phthalate, di(2-ethylhexyl) phthalate, dinonyl phthalate, dilauryl phthalate, butyllauryl phthalate, and butylbenzyl phthalate, aliphatic dibasic esters, e.g., di (2-ethylhexyl) adipate, and di(2-ethylhexyl) sebacate, phosphoric triesters, e.g., tricresyl phosphate and tri(2-ethylhexyl) phosphate, polyol polyesters, e.g., polyethylene glycol ester, andepoxy compounds, e.g., epoxy fatty acid ester. Of these compounds, esters of vinyl monomers, in particular, acrylic esters and methacrylic esters are preferred in view of the improvement of transfer sensitivity, the improvement of transfer unevenness, and the big controlling effect of breaking elongation.

As the acrylic or methacrylic ester compounds, polyethylene glycol dimethacrylate, 1,2,4-butanetriol trimethacrylate, trimethylolethane triacrylate, pentaerythritol acrylate, pentaerythritol tetraacrylate, dipentaerythritol polyacrylate can be exemplified.

The above plasticizers may be high polymers, and polyesters are preferred above all, since the addition effect is large and they hardly diffuse under storage conditions. As the polyesters, e.g., sebacic acid polyester and adipic acid polyester are exemplified.

The additives contained in the image-forming layer are not limited these compounds. The plasticizers may be used alone or in combination of two or more.

When the content of these additives in the image-forming layer are too much, in some cases, the resolution of the transferred image is deteriorated, the film strength of the image-forming layer itself is reduced, or sometimes the unexposed area is transferred to the image-receiving sheet due to the reduction of the adhesion of the light-to-heat converting layer and the image-forming layer. From the above viewpoint, the content of the waxes is preferably from 0.1 to 30 mass % of the entire solid content in the image-forming layer, more preferably from 1 to 20 mass %. The content of the plasticizers is preferably from 0.1 to 20 mass % of the entire solid content in the image-forming layer, more preferably from 0.1 to 10 mass %.

(3) Others

In addition to the above components, the image-forming layer may further contain a surfactant, inorganic or organic fine particles (metallic powder and silica gel), oils (e.g., linseed oil and mineral oil), a thickener and an antistatic agent. Except for the case of obtaining a black image, energy necessary for transfer can be reduced by containing the materials which absorb the wavelengths of light sources for use in image recording. As the materials which absorb the wavelengths of light sources, either pigments or dyes may be used, but in the case of obtaining a color image, it is preferred in view of color reproduction to use infrared light sources such as a semiconductor laser in image recording and use dyes having less absorption in the visible region and large absorption in the wavelengths of light sources. As the examples of infrared absorbing dyes, the compounds disclosed in JP-A-3-103476 can be exemplified.

The image-forming layer can be provided by dissolving or dispersing the pigment and the binder, to thereby prepare a coating solution, coating the coating solution on the light-to-heat converting layer (when the following heat-sensitive peeling layer is provided on the light-to-heat converting layer, on the heat-sensitive peeling layer) and drying. As the solvent for use in the preparation of the coating solution, n-propyl alcohol, methyl ethyl ketone, propylene glycol monomethyl ether (MFG), methanol and water can be exemplified. Coating and drying can be performed according to ordinary coating and drying methods.

A heat-sensitive peeling layer containing a heat-sensitive material which generates gas by the action of the heat generated in the light-to-heat converting layer or releases adhesive moisture to thereby lower the adhesion strength between the light-to-heat converting layer and the image-forming layer can be provided on the light-to-heat converting layer in the heat transfer sheet. As such heat-sensitive materials, compounds (polymers or low molecular compounds) which themselves are decomposed by heat, or properties of which are changed by heat, and generate gas, and compounds (polymers or low molecular compounds) which are absorbing, or are being adsorbed with, an equivalent amount of easily-vaporizing gases, such as moisture, can be used. These compounds may be used in combination.

As the examples of the polymers which themselves are decomposed by heat, or properties of which are changed by heat, and generate gas, self oxidizing polymers, e.g., nitrocellulose, halogen-containing polymers, e.g., chlorinated polyolefin, chlorinated rubber, poly-rubber chloride, polyvinyl chloride, and polyvinylidene chloride, acryl-based polymers, e.g., polyisobutyl methacrylate which is being adsorbed with volatile compound such as moisture, cellulose esters, e.g., ethyl cellulose which is being adsorbed with volatile compound such as moisture, and natural high molecular compounds, e.g., gelatin which is being adsorbed with volatile compound such as moisture can be exemplified. As the examples of low molecular compounds which are decomposed by heat or properties of which are changed by heat and generate gas, diazo compounds and azide compounds which generate heat, decomposed and generate gas can be exemplified.

Decomposition and property change by heat of the heat-sensitive material as described above preferably occur at 280° C. or less, particularly preferably 230° C. or less.

When low molecular compounds are used as the heat-sensitive material of the heat-sensitive peeling layer, it is preferred to combine the material with a binder. As the binder, the polymers which themselves are decomposed by heat, or properties of which are changed by heat, and generate gas can be used, but ordinary binders which do not have such property can also be used. When the heat-sensitive low molecular compound is used in combination with a binder, the mass ratio (i.e., the weight ratio) of the former to the latter is preferably from 0.02/1 to 3/1, more preferably from 0.05/1 to 2/1. It is preferred that the heat-sensitive peeling layer cover the light-to-heat converting layer almost entirely and the thickness of the heat-sensitive peeling layer is generally from 0.03 to 1 μm, and preferably from 0.05 to 0.5 μm.

When the constitution of the heat transfer sheet comprises a support having provided thereon a light-to-heat converting layer, a heat-sensitive peeling layer and an image-forming layer in this order, the heat-sensitive peeling layer is decomposed by heat conducted from the light-to-heat converting layer, or properties of which are changed by heat, and generates gas. The heat-sensitive peeling layer is partially lost or cohesive failure is caused in the heat-sensitive peeling layer due to the decomposition or gas generation, as a result the adhesion strength between the light-to-heat converting layer and the image-forming layer is lowered and, according to the behavior of the heat-sensitive peeling layer, a part of the heat-sensitive peeling layer is adhered on the image-forming layer and migrates to the surface of the image finally formed with the image-forming layer and thereby causes color mixing of the image. Therefore, it is preferred that the heat-sensitive peeling layer is scarcely colored, i.e., the heat-sensitive peeling layer shows high transmittance to visible rays, so that color mixing does not appear visually on the image formed, even if such transfer of the heat-sensitive peeling layer occurs. Specifically, the absorptivity of the heat-sensitive peeling layer to visible rays is 50% or less, preferably 10% or less.

Further, instead of providing an independent heat-sensitive peeling layer, the heat transfer sheet may take the constitution such that the light-to-heat converting layer is formed by adding the heat-sensitive material to the coating solution of the light-to-heat converting layer, and the light-to-heat converting layer doubles as the heat-sensitive peeling layer.

It is preferred that the coefficient of static friction of the outermost layer of the heat transfer sheet of the side on which the image-forming layer is provided is 0.35 or less, preferably 0.20 or less. When the coefficient of static friction of the outermost layer is 0.35 or less, the contamination of the roll for carrying the heat transfer sheet can be suppressed and the quality of the image formed can be improved. The measurement of coefficient of static friction is according to the method disclosed in paragraph [0011] of JP-A-2001-47753.

It is preferred that the image-forming layer surface has Smooster value at 23° C., 55% RH of from 0.5 to 50 mmHg (=about 0.0665 to 6.65 kPa), and Ra of from 0.05 to 0.4 μm, which can reduce a great number of micro voids by which the image-receiving layer and the image-forming layer cannot be brought into contact with each other at the contact area, which is preferred in the point of transfer and image quality. The Ra value can be measured by a surface roughness meter (Surfcom, manufactured by Tokyo Seiki Co., Ltd.) according to JIS B0601. It is preferred that the surface hardness (defined in JIS K 5600-5-5) of the image-forming layer is 10 g or more when measured with a sapphire needle. When the image-forming layer is electrically charged according to U.S. test standard 4046 and then grounded, the electrification potential 1 second after grounding of the image-forming layer is preferably from −100 to 100 V. It is preferred that the surface resistance of the image-forming layer at 23° C., 55% RH is $10^9$ Ω or less.

In the next place, the image-receiving sheet which can be used in combination with the heat transfer sheet is described below.

Image-Receiving Sheet

Layer Constitution

The constitution of the image-receiving sheet generally comprises a support having provided thereon one or more image-receiving layer(s) and, if necessary, any one or two or more layer(s) of a cushioning layer, a peeling layer and an intermediate layer is(are) provided between the support and the image-receiving layer. It is preferred in view of conveyance to provide a backing layer on the surface of the support opposite to the side on which the image-receiving layer is provided.

Support

A plastic sheet, a metal sheet, a glass sheet, a resin-coated paper, a paper, and ordinary sheet-like substrate materials, e.g., various composites, are used as the support.

As the examples of plastic sheets, a polyethylene terephthalate sheet, a polycarbonate sheet, a polyethylene sheet, a polyvinyl chloride sheet, a polyvinylidene chloride sheet, a polystyrene sheet, a styrene-acrylonitrile sheet, and a polyester sheet can be exemplified. As the examples of papers, an actual printing paper and a coated paper can be used.

It is preferred for the support to have minute voids in view of capable of improving the image quality. Such supports can be produced by mixing a thermoplastic resin and a filler comprising an inorganic pigment and a high polymer incompatible with the above thermoplastic resin to thereby prepare a mixed melt, extruding the mixed melt by a melt extruder to prepare a monolayer or multilayer film, and further monoaxially or biaxially stretching the film. In this step, the void ratio is determined by the selection of the resin and the filler, a mixing ratio and stretching condition.

As the thermoplastic resins, a polyolefin resin, such as polypropylene, and a polyethylene terephthalate resin are preferred, since they are excellent in crystallizability and orientation property and voids can be formed easily. It is preferred to use the polyolefin resin or the polyethylene terephthalate resin as the main component and use a small amount of other thermoplastic resin arbitrarily in combination. The inorganic pigments for use as the filler preferably have an average particle size of from 1 to 20 μm, e.g., calcium carbonate, clay, diatomaceous earth, titanium oxide, aluminum hydroxide and silica can be used. As the incompatible resins for use as the filler, when polypropylene is used as the thermoplastic resin, it is preferred to combine polyethylene terephthalate as the filler. A support having minute voids is disclosed in detail in JP-A-2001-105752.

The content of the filler, e.g., an inorganic pigment, in the support is generally from 2 to 30% by volume or so.

The thickness of the support in the image-receiving sheet is generally from 10 to 400 μm, preferably from 25 to 200 μm. For enhancing the adhesion with the image-receiving layer (or the cushioning layer) or with the image-forming layer in the heat transfer sheet, the surface of the support in the image-receiving sheet may be subjected to surface treatment, e.g., corona discharge treatment and glow discharge treatment.

Image-receiving Layer

It is preferred to provide one or more image-receiving layer(s) on the support in the image-receiving sheet for transferring and fixing the image-forming layer on the image-receiving sheet. The image-receiving layer is preferably a layer formed with an organic polymer binder as the main component. The binders are preferably thermoplastic resins, such as homopolymers and copolymers of acryl-based monomers, e.g., acrylic acid, methacrylic acid, acrylic acid ester, and methacrylic acid ester, cellulose-based polymers, e. g., methyl cellulose, ethyl cellulose and cellulose acetate, homomonomers and copolymers of vinyl-based monomers, e.g., polystyrene, polyvinyl pyrrolidone, polyvinyl butyral, polyvinyl alcohol and polyvinyl chloride, condensed polymers, e.g., polyester and polyamide, and rubber-based polymers, e.g., butadiene-styrene copolymer. The binder for use in the image-receiving layer is preferably a polymer having a glass transition temperature (Tg) of 90° C. or lower for obtaining appropriate adhesion with the image-forming layer. For that purpose, it is possible to add a plasticizer to the image-receiving layer. The binder polymer preferably has Tg of 30° C. or more for preventing blocking between sheets. As the binder polymer of the image-receiving layer, the same or analogous monomer unit as the monomer unit constituting the binder polymer of the image-forming layer is preferably used from the point of improving the adhesion with the image-forming layer at laser recording and improving sensitivity and image strength.

It is preferred that the image-receiving layer surface has Smooster value (i.e., Smooster smoothness: JAPAN TAPPI No. 5) at 23° C., 55% RH of from 0.5 to 50 mmHg (=about 0.0665 to 6.65 kPa), which can reduce a great number of micro voids by which the image-receiving layer and the image-forming layer cannot be brought into contact with each other at the contact area, which is preferred in the point of transfer and image quality. When the image-receiving layer is electrically charged according to U.S. test standard 4046 and then grounded, the electrification potential 1 second after grounding of the image-receiving layer is preferably from −100 to 100 V. It is preferred that the surface resistance of the image-receiving layer at 23° C., 55% RH is $10^9$ Ω or less. It is preferred that the surface energy of the surface of the image-receiving layer is from 23 to 35 $mg/m^2$.

When the image once formed on the image-receiving layer is re-transferred to the actual printing paper, it is also preferred that at least one image-receiving layer is formed of a photo-setting material. As the composition of such a photo-setting material, combination comprising a) a photopolymerizable monomer comprising at least one kind of a polyfunctional vinyl or vinylidene compound which can form a photopolymer by addition polymerization, b) anorganic polymer, and c) a photopolymerization initiator, and, if necessary, additives, e.g., a thermal polymerization inhibitor can be exemplified. As the above polyfunctional vinyl monomer, unsaturated ester of polyol, in particular, an acrylic or methacrylic ester (ethylene glycol diacrylate, pentaerythritol tetraacrylate) is used.

As the organic polymer, the polymers for use for forming the image-receiving layer can be exemplified. As the photopolymerization initiator, an ordinary photo-radical polymerization initiator, e.g., benzophenone and Michler's ketone, can be used in proportion of from 0.1 to 20 mass % in the layer.

The thickness of the image-receiving layer is generally from 0.3 to 7 $\mu$m, preferably from 0.7 to 4 $\mu$m. When the thickness of the image-receiving layer is less than 0.3 $\mu$m, the film strength is insufficient at re-transferring to the actual printing paper and the film breaks easily. While when the thickness of the image-receiving layer is too thick, the glossiness of the image after re-transferring to the actual printing paper increases, and the approximation to the printed matter is reduced.

When the surface of the image-receiving sheet is subjected to cleaning with an adhesive roller, for certainly removing foreign matters without causing peeling of the image-receiving layer, the adhesive strength of the image-receiving layer and the underlayer of the image-receiving layer (a support, or a corresponding layer when a cushioning layer or a peeling layer is provided) is from 20 to 100 mN/cm, preferably from 40 to 70 mN/cm, the static friction coefficient of the image-receiving layer surface is 0.7 or less, preferably 0.4 or less, and the surface roughness Rz of the image-receiving layer surface is from 1 to 5 $\mu$m, preferably from 2 to 4 $\mu$m.

Other Layers

A cushioning layer may be provided between the support and the image-receiving layer. When a cushioning layer is provided, it is possible to increase the adhesion of the image-forming layer and the image-receiving layer at heat transfer by laser and the image quality can be improved. Further, even if foreign matters enter between the heat transfer sheet and the image-receiving sheet during recording, the voids between the image-receiving layer and the image-forming layer are reduced by the deforming action of the cushioning layer, as a result the size of image defect such as clear spots can be made small. Further, when the image formed by transfer is re-transferred to the actual printing paper, since the surface of the image-receiving layer is deformed according to the surface unevenness of the paper surface, the transferring property of the image-receiving layer can be improved. Further, by reducing the glossiness of the transferred image, the approximation to the printed matter can be improved.

The cushioning layer is formed to be liable to be deformed when stress is laid on the image-receiving layer, hence for obtaining the above effect, the cushioning layer preferably comprises material shaving a low modulus of elasticity, materials having elasticity of a rubber, or thermoplastic resins easily softened by heat. The modulus of elasticity of the cushioning layer at room temperature is preferably from 0.5 MPa to 1.0 GPa, more preferably from 1 MPa to 0.5 GPa, and particularly preferably from 10 to 100 MPa. For burying foreign matters such as dust, the penetration according to JIS K2530 (25° C., 100 g, 5 seconds) is preferably 10 or more. The cushioning layer has a glass transition temperature of 80° C. or less, preferably 25° C. or less, and a softening point of preferably from 50 to 200° C. It is also preferred to add a plasticizer to the binder for controlling these physical properties, e.g., Tg.

As the specific materials for use as the binder of the cushioning layer, besides rubbers, e.g., urethane rubber, butadiene rubber, nitrile rubber, acryl rubber and natural rubber, polyethylene, polypropylene, polyester, styrene-butadiene copolymer, ethylene-vinyl acetate copolymer, ethylene-acryl copolymer, vinyl chloride-vinyl acetate copolymer, vinylidene chloride resin, vinyl chloride resin containing a plasticizer, polyamide resin and phenol resin can be exemplified.

The thickness of the cushioning layer varies according to the resins used and other conditions, but is generally from 3 to 100 $\mu$m, preferably from 10 to 52 $\mu$m.

It is necessary that the image-receiving layer and the cushioning layer are adhered to each other until the stage of laser recording, but it is preferred that they are designed to be peelable for transferring an image to the actual printing paper. For easy peeling, it is also preferred to provide a peeling layer having a thickness of from 0.1 to 2 $\mu$m or so between the cushioning layer and the image-receiving layer. When the thickness of the peeling layer is too thick, the properties of the cushioning layer are difficult to be exhibited, thus it is necessary to adjust the thickness by the kind of the peeling layer.

The specific examples of the binders of the peeling layer include thermo-setting resins having Tg of 65° C. or more, e.g., polyolefin, polyester, polyvinyl acetal, polyvinyl formal, polyparabanic acid, methyl polymethacrylate, polycarbonate, ethyl cellulose, nitrocellulose, methyl cellulose, carboxymethyl cellulose, hydroxypropyl cellulose, polyvinyl alcohol, polyvinyl chloride, urethane resin, fluorine resin, styrenes, e.g., polystyrene and acrylonitrile styrene, crosslinked products of these resins, polyamide, polyimide, polyether imide, polysulfone, polyether sulfone, aramid, and hardened products of these resins. As the hardening agent, generally used hardening agents, e.g., isocyanate and melamine, can be used.

When the binders of the peeling layer are selected by taking the above physical properties into consideration, polycarbonate, acetal and ethyl cellulose are preferred in view of the storage stability, and further, when acrylate resins are added to the image-receiving layer, peelability (i.e., peeling property) at re-transferring of the image after laser-heat transfer becomes good and preferred.

Further, a layer whose adhesion with the image-receiving layer extremely lowers by cooling can be used as the peeling layer. Specifically, layers containing heat fusion compounds such as waxes and binder, and thermoplastic resins as the main component can be used as such a layer.

The examples of the heat fusion compounds are disclosed in JP-A-63-193886. In particular, micro crystalline wax, paraffin wax, and carnauba wax are preferably used. As the thermoplastic resins, ethylene-based copolymers, e.g., ethylene-vinyl acetate resins and cellulose-based resins are preferably used.

As the additives, higher fatty acid, higher alcohol, higher fatty acid ester, amides, and higher amine can be added to the peeling layer, according to necessity.

As another constitution of the peeling layer, there is a layer which has peelability by causing cohesive failure due to fusion or softening by heating. It is preferred to add a supercooling substance to such a peeling layer.

As the supercooling substance, poly-ϵ-caprolactone, polyoxyethylene, benzotriazole, tribenzylamine and vanillin can be exemplified.

In another constitution of the peeling layer, a compound to reduce the adhesion with the image-receiving layer is added to the peeling layer. As such compounds, silicone-based resins, e.g., silicone oil; Teflon, fluorine-based resins, e.g., fluorine-containing acrylate resin; polysiloxane resins; acetal-based resins, e.g., polyvinyl butyral, polyvinyl acetal and polyvinyl formal; solid waxes, e.g., polyethylene wax and amide wax; and fluorine-based and phosphoric ester-based surfactants can be exemplified.

The peeling layer can be prepared by dissolving the above materials in a solvent or dispersing the above materials in a latex state, and coating the above solution or dispersion on the cushioning layer by a blade coater, a roll coater, a bar coater, a curtain coater, or gravure coater, or extrusion lamination by hot melt. As another method, the solution or dispersion obtained by dissolving the above materials in a solvent or dispersing the above materials in a latex state is coated on a temporary base by the above coating method, the temporary base is adhered with the cushioning layer, and then the temporary base is peeled.

In the image-receiving sheet to be combined with the heat transfer sheet, the image-receiving layer may double as the cushioning layer, and in that case, the image-receiving sheet may take the constitution such as support/cushioning image-receiving layer, or support/undercoat layer/cushioning image-receiving layer. In this case, it is also preferred that cushioning image-receiving layer has peelability so that re-transferring to the actual printing paper is possible. In this case, the image after being re-transferred to the actual printing paper becomes a glossy image.

The thickness of the cushioning image-receiving layer is from 5 to 100 μm, preferably from 10 to 40 μm.

It is preferred to provide a backing layer on the side of the support of the image-receiving sheet opposite to the side on which the image-receiving layer is provided for improving the traveling property of the image-receiving sheet. When a surfactant, an antistatic agent, e.g., fine particles of tin oxide, and a matting agent, e.g., silicon oxide and PMMA particles, are added to the backing layer, the traveling property in the recording unit is improved.

These additives can be added not only to the backing layer but also to the image-receiving layer and other layers, if desired. The kinds of the additives cannot be prescribed unconditionally according to purposes, but a matting agent having an average particle size of from 0.5 to 10 μm can be added in concentration of from 0.5 to 80% or so, and an antistatic agent can be added by selecting arbitrarily from among various surfactants and electrically conductive agents so that the surface resistance of the layer at 23° C., 50% RH becomes preferably $10^{12}$ Ω or less, more preferably $10^9$ Ω or less.

As the binder for use in the backing layer, widely used polymers can be used, e.g., gelatin, polyvinyl alcohol, methyl cellulose, nitrocellulose, acetyl cellulose, aromatic polyamide resin, silicone resin, epoxy resin, alkyd resin, phenol resin, melamine resin, fluorine resin, polyimide resin, urethane resin, acryl resin, urethane-modified silicone resin, polyethylene resin, polypropylene resin, polyester resin, Teflon resin, polyvinyl butyral resin, vinyl chloride-based resin, polyvinyl acetate, polycarbonate, organic boron compounds, aromatic esters, polyurethane fluoride, and polyether sulfone can be used.

When crosslinkable water-soluble binder is used as the binder of the backing layer for crosslinking, dropout prevention of a matting agent and scratch resistance of the backing layer are improved, further it is effective for blocking during storage.

The crosslinking means can be selected with no limitation from heat, actinic rays and pressure, according to the characteristics of the crosslinking agent to be used, and these may be used alone or in combination. For providing an adhering property to the support, an arbitrary adhesion layer may be provided on the same side of the support on which the backing layer is provided.

Organic or inorganic fine particles are preferably added to the backing layer as the matting agent. As the organic matting agent, polymethyl methacrylate (PMMA), polystyrene, polyethylene, polypropylene, fine particles of other radical polymers, and condensed polymers such as polyester and polycarbonate are exemplified.

The backing layer is preferably provided in an amount of about 0.5 to 5 g/m². When the amount is less than 0.5 g/m², coating property is unstable and a problem of dropout of the matting agent is liable to occur. While when the coating amount greatly exceeds 5 g/m², the preferred particle size of the matting agent becomes extremely large and embossing of the image-receiving layer surface by the backing layer is caused during storage, and in the heat transfer of a thin image-forming layer, the dropout of the recorded image and unevenness are liable to occur.

The number average particle size of the matting agent is preferably larger than the layer thickness of the backing layer containing a binder alone by 2.5 to 20 μm. Of the matting agents, particles having a particle size of 8 μm or more are necessary to be present in an amount of 5 mg/$m^2$ or more, preferably from 6 to 600 mg/$m^2$, by which the defect due to foreign matters can be improved. Further, when a matting agent of narrow particle size distribution is used, i.e., when a matting agent having the value obtained by dividing the standard deviation of the particle size distribution by the number average particle size, a/rn (the variation coefficient of particle size distribution) of 0.3 or less is used, the defect which occurs when particles having an extraordinary big particle size are used can be improved, and further, the desired performance can be obtained with the less addition amount. The variation coefficient is more preferably 0.15 or less.

It is preferred to add an antistatic agent to the backing layer for the purpose of preventing adhesion of foreign matters due to the frictional electrification with a carrier roller. As the antistatic agent, a cationic surfactant, an anionic surfactant, a nonionic surfactant, a high molecular antistatic agent, electrically conductive fine particles, in addition, the compounds described in 11290 *no Kagaku Shohin* (*Chemical Commercial Products of* 11290), pp. 875 and 876, Kagaku Kogyo Nippo-Sha can be widely used.

As antistatic agents which can be used in the backing layer in combination, of the above compounds, metallic oxide, e.g., carbon black, zinc oxide, titanium oxide and tin oxide, and electrically conductive fine particles, e.g., organic semiconductors, are preferably used. In particular, when electrically conductive fine particles are used, the dissociation of the antistatic agent from the backing layer can be prevented, and stable antistatic effect can be obtained irrespective of the surroundings.

It is also possible to add a mold-peeling agent, e.g., various activators, silicone oil, and fluorine resins, to the backing layer for providing a coating property and a mold-peeling property.

When the softening point of the cushioning layer and the image-receiving layer measured by TMA (Thermomechanical Analysis) is 70° C. or lower, the backing layer is particularly preferred.

TMA softening point is obtained by observing the phase of the object with increasing the temperature of the object of observation at constant rate and applying a constant load to the object. In the present invention, the temperature at the time when the phase of the object begins to change is defined as TMA softening point. The softening point by TMA can be measured with an apparatus such as Thermoflex (manufactured by Rigaku Denki-Sha Co.).

The heat transfer sheet and the image-receiving sheet can be used in image forming as the laminate by superposing the image-forming layer in the heat transfer sheet and the image-receiving layer in the image-receiving sheet.

The laminate of the heat transfer sheet and the image-receiving sheet can be produced by various methods. For example, the laminate can be easily obtained by superposing the image-forming layer in the heat transfer sheet and the image-receiving layer in the image-receiving sheet and passing through a pressure and heating roller. The heating temperature in this case is 160° C. or less, preferably 130° C. or less.

The above-described vacuum adhesion method can also be preferably used for obtaining the laminate. The vacuum adhesion method is a method of winding the image-receiving sheet around the drum provided with suction holes for vacuum sucking, and then vacuum-adhering the heat transfer sheet of a little larger size than the image-receiving sheet on the image-receiving sheet with uniformly blasting air by a squeeze roller. As other method, a method of mechanically sticking the image-receiving sheet on a metal drum with pulling the image-receiving sheet, and further mechanically sticking the heat transfer sheet thereon with pulling in the same manner can also be used. Of these methods, the vacuum adhesion method is especially preferred in the point of requiring no temperature control and capable of effecting lamination rapidly and uniformly.

EXAMPLE

The present invention will be described in detail with reference to the examples below but the present invention is not limited thereto at all. In the examples, "parts" means "parts by mass (i.e., parts by weight)" unless otherwise indicated.

Preparation of Heat Transfer Sheet K (black)

Formation of Backing Layer

Preparation of First Backing Layer Coating Solution

| | |
|---|---|
| Water dispersion solution of acrylic resin (Julymer ET410, solid content: 20 mass %, manufactured by Nippon Junyaku Co., Ltd.) | 2 parts |
| Antistatic agent (water dispersion of tin oxide-antimony oxide, average particle size: 0.1 μm, 17 mass %) | 7.0 parts |
| polyoxyethylenephenyl ether | 0.1 part |
| Melamine compound (Sumitic Resin M-3, manufactured by Sumitomo Chemical Industry Co., Ltd.) | 0.3 parts |
| Distilled water to make the total amount | 100 parts |

Formation of First Backing Layer

One surface (back surface) of a biaxially stretched polyethylene terephthalate support (Ra of both surfaces was 0.01 μm) having a thickness of 75 μm was subjected to corona discharge treatment. The first backing layer coating solution was coated on the support in dry coating thickness of 0.03 μm, and the coated layer was dried at 180° C. for 30 seconds, thereby the first backing layer was prepared. The Young's modulus of the support in the machine direction was 450 kg/$mm^2$ (=about 4.4 GPa), and the Young's modulus of the support in the transverse direction was 500 kg/$mm^2$ (=about 4.9 GPa). The F-5 value of the support in the machine direction was 10 kg/$mm^2$ (=about 98 MPa), and the F-5 value of the support in the transverse direction was 13 kg/$mm^2$ (=about 127.4 MPa), the heat shrinkage rate at 100° C. for 30 minutes of the support in the machine direction was 0.3%, and that in the transverse direction was 0.1%. The breaking strength was 20 kg/$mm^2$ (=about 196 MPa) in the machine direction, and that in the transverse direction was 25 kg/$mm^2$ (=about 245 MPa) in the transverse direction, and the modulus of elasticity was 400 kg/$mm^2$ (=about 3.9 GPa).

Preparation of Second Backing Layer Coating Solution

| | |
|---|---|
| Polyolefin (Chemipearl S-120, 27 mass %, manufactured by Mitsui Petrochemical Industries, Ltd.) | 3.0 parts |
| Antistatic agent (water dispersion 2.0 parts of tin oxide-antimony oxide, average particle size: 0.1 μm, 17 mass %) | |
| Colloidal silica (Snowtex C, 20 mass %, manufactured by Nissan Chemical Industries, Ltd.) | 2.0 parts |
| Epoxy compound (Denacol EX-614B, manufactured by Nagase Kasei Co., Ltd.) | 0.3 parts |
| Distilled water to make the total amount | 100 parts |

Formation of Second Backing Layer

The second backing layer coating solution was coated on the first backing layer in dry coating thickness of 0.03 μm, and the coated layer was dried at 170° C. for 30 seconds, thereby the second backing layer was prepared.

1) Preparation of Light-to-heat Converting Layer Coating Solution

The following components were mixed with stirring by a stirrer and the light-to-heat converting layer coating solution was prepared.

Composition of Light-to-heat Converting Layer Coating Solution

Infrared absorbing dye (NK-2014, 7.6 parts manufactured by Nippon Kanko Shikiso Co., Ltd., a cyanine dye having the following composition)

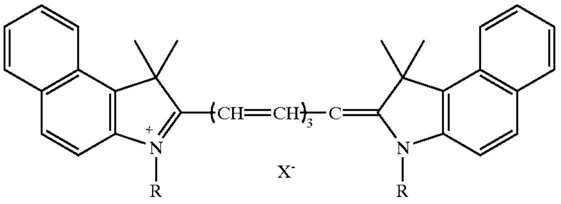

In the formula, R represents $CH_3$ and $X^-$ represents $ClO_4^-$.

Polyimide resin represented by the 29.3 parts following formula (Rikacoat SN-20F, manufactured by Shin Nihon Rika K.K., heat decomposition temperature: 510° C.)

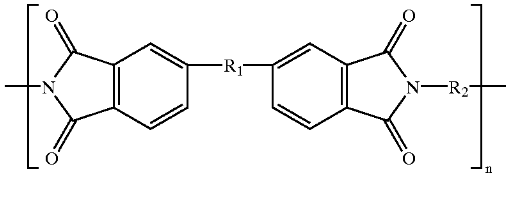

In the formula, $R_1$ represents $SO_2$ and $R_2$ represents the following formula:

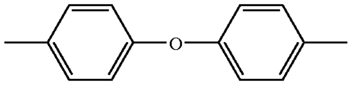

or

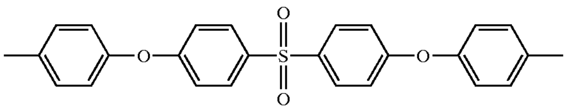

| | |
|---|---|
| Exxon naphtha | 5.8 parts |
| N-Methylpyrrolidone (NMP) | 1,500 parts |
| Methyl ethyl ketone | 360 parts |
| Surfactant (Megafac F-176PF, manufactured by Dainippon Chemicals and Ink Co., Ltd., fluorine surfactant) | 0.5 parts |
| Dispersion solution of matting agent having the following composition | 14.1 parts |

Dispersion Solution of Matting Agent

| | |
|---|---|
| N-Methyl-2-pyrrolidone (NMP) | 69 parts |
| Methyl ethyl ketone | 20 parts |
| Styrene-acrylate resin (Joncryl 611, manufactured by Johnson Polymer Co., Ltd.) | 3 parts |
| $SiO_2$ Particles (Sea Hoster-KEP150, silica particles, manufactured by Nippon Shokubai Co., Ltd.) | 8 parts |

2) Formation of Light-to-heat Converting Layer on Support Surface

The above light-to-heat converting layer coating solution was coated with a wire bar coater on one surface of a polyethylene terephthalate film (support) having a thickness of 75 μm, and the coated product was dried in an oven at 120° C. for 2 minutes, thereby a light-to-heat converting layer was formed on the support. The optical density OD of the obtained light-to-heat converting layer at wavelength of 808 nm measured by UV-spectrophotometer UV-240 (manufactured by Shimadzu Seisakusho Co. Ltd.) was 1.03, and the layer thickness measured with a scanning electron microscope was 0.3 μm on average.

3) Preparation of Black Image-forming Layer Coating Solution

Each of the following components was put in a kneading mill, and pre-treatment was performed with adding a small amount of a solvent and applying a shear force. The solvent was further added to the dispersion so as to reach the following composition, and dispersion was performed for two hours in a sand mill, thereby the mother solution of a pigment dispersion was obtained.

Composition of Black Pigment Dispersion Mother Solution

Composition 1

| | |
|---|---|
| Polyvinyl butyral (Eslec B BL-SH, manufactured by Sekisui Chemical Industries, Ltd.) | 12.6 parts |

-continued

| | |
|---|---|
| Pigment Black 7 (carbon black, C.I. No. 77266, Mitsubishi Carbon Black #5, manufactured by Mitsubishi Chemicals Co. Ltd., PVC blackness: 1) | 4.5 parts |
| Dispersing aid (Solspers S-20000, manufactured by ICI Co.) | 0.8 parts |
| n-Propyl alcohol | 79.4 parts |

Composition 2

| | |
|---|---|
| Polyvinyl butyral (Eslec B BL-SH, manufactured by Sekisui Chemical Industries, Ltd.) | 12.6 parts |
| Pigment Black 7 (carbon black, C.I. No. 77266, Mitsubishi Carbon Black MA100, manufactured by Mitsubishi Chemicals Co., Ltd., PVC blackness: 10) | 10.5 parts |
| Dispersing aid (Solspers S-20000, manufactured by ICI Co.) | 0.8 parts |
| n-Propyl alcohol | 79.4 parts |

The following components were mixed by stirring with a stirrer to prepare a black image-forming layer coating solution.

Composition of Black Image-forming Layer Coating Solution

| | |
|---|---|
| Above black pigment dispersion mother solution (composition 1/composition 2: 70/30 (parts)) | 185.7 parts |
| Polyvinyl butyral (Eslec B BL-SH, manufactured by Sekisui Chemical Industries, Ltd.) | 11.9 parts |
| Wax-based compound | |
| Stearic acid amide (Newtron 2, manufactured by Nippon Seika Co., Ltd.) | 1.7 parts |
| Behenic acid amide (Diamid BM, (manufactured by Nippon Kasei Co., Ltd.) | 1.7 parts |
| Lauric acid amide (Diamid Y, (manufactured by Nippon Kasei Co., Ltd.) | 1.7 parts |
| Palmitic acid amide (Diamid KP, (manufactured by Nippon Kasei Co., Ltd.) | 1.7 parts |
| Erucic acid amide (Diamid L-200, (manufactured by Nippon Kasei Co., Ltd.) | 1.7 parts |
| Oleic acid amide (Diamid O-200, (manufactured by Nippon Kasei Co., Ltd.) | 1.7 parts |
| Rosin (KE-311, manufactured by Arakawa Kagaku Co., Ltd. components: resin acid 80–97%, resin acid components: abietic acid: 30 to 40% neoabietic acid: 10 to 20% dihydroabietic acid: 14% tetrahydroabietic acid: 14%) | 11.4 parts |
| Surfactant (Megafac F-176PF, solid content: 20%, manufactured by Dai-Nippon Ink & Chemicals Inc.) | 2.1 parts |
| Inorganic pigment (MEK-ST, 30% methyl ethyl ketone solution, manufactured by Nissan Chemical Industries, Ltd.) | 7.1 parts |
| n-Propyl alcohol | 1,050 parts |
| Methyl ethyl ketone | 295 parts |

It was found that the particles in the thus-obtained black image-forming layer coating solution had an average particle size of 0.25 μm, and the ratio of the particles having a particle size of 1 μm or more was 0.5% from the measurement by particle size distribution measuring apparatus of laser scattering system.

4) Formation of Black Image-forming Layer on Light-to-heat Converting Layer Surface The above black image-forming layer coating solution was coated on the light-to-heat converting layer with a wire bar coater for 1 minute, and the coated product was dried in an oven at 100° C. for 2 minutes, thus a black image-forming layer was formed on the light-to-heat converting layer. By the above procedure, a heat transfer sheet (hereinafter referred to as heat transfer sheet K, similarly, a heat transfer sheet provided with a yellow image-forming layer is referred to as heat transfer sheet Y, a heat transfer sheet provided with a magenta image-forming layer is referred to as heat transfer sheet M, and a heat transfer sheet provided with a cyan image-forming layer is referred to as heat transfer sheet C) comprising a support having provided thereon a light-to-heat converting layer and a black image-forming layer in this order from the support was prepared.

The optical density (OD) of the black image-forming layer in the thus-obtained heat transfer sheet K was 0.91 measured by Macbeth densitometer TD-904 (W filter), and the layer thickness of the black image-forming layer was 0.60 μm on average.

The obtained image-forming layer had the following physical properties.

The surface hardness of the image-forming layer is preferably 10 g or more when measured with a sapphire needle, and specifically 200 g or more.

The Smooster value of the surface at 23° C., 55% RH is preferably from 0.5 to 50 mm Hg (=about 0.0665 to 6.65 kPa), and specifically 9.3 mm Hg (=about 1.24 kPa).

The coefficient of static friction of the surface is preferably 0.2 or less, and specifically 0.08.

Preparation of Heat Transfer Sheet Y

Heat transfer sheet Y was prepared in the same manner as in the preparation of heat transfer sheet K, except that the yellow image-forming layer coating solution having the composition shown below was used in place of the black image-forming layer coating solution. The layer thickness of the image-forming layer in the obtained heat transfer sheet Y was 0.42 μm.

Composition of Yellow Pigment Dispersion Mother Solution

Yellow Pigment Composition 1

| | |
|---|---|
| Polyvinyl butyral (Eslec B BL-SH, manufactured by Sekisui Chemical Industries, Ltd.) | 7.1 parts |
| Pigment Yellow (pigment yellow 180, C.I. No. 21290) (Novoperm Yellow P-HG, manufactured by Clariant Japan, K.K.) | 12.9 parts |
| Dispersing aid (Solspers S-20000, manufactured by ICI Co.) | 0.6 parts |
| n-Propyl alcohol | 79.4 parts |

Composition of Yellow Pigment Dispersion Mother Solution

Yellow Pigment Composition 2

| | |
|---|---|
| Polyvinyl butyral (Eslec B BL-SH, manufactured by Sekisui Chemical Industries, Ltd.) | 7.1 parts |

-continued

| | |
|---|---|
| Pigment Yellow 139 (carbon black, C.I. No. 56298) (Novoperm Yellow M2R 70, manufactured by Clariant Japan, K.K.) | 12.9 parts |
| Dispersing aid (Solspers S-20000, manufactured by ICI Co.) | 0.6 parts |
| n-Propyl alcohol | 79.4 parts |

Composition of Yellow Image-forming Layer Coating Solution

| | |
|---|---|
| Above yellow pigment dispersion mother solution (yellow pigment composition 1/ yellow pigment composition 2: 95/5 (parts)) | 126 parts |
| Polyvinyl butyral (Eslec B BL-SH, manufactured by Sekisui Chemical Industries, Ltd.) | 4.6 parts |
| Wax-based compound | |
| Stearic acid amide (Newtron 2, manufactured by Nippon Seika Co., Ltd.) | 0.7 parts |
| Behenic acid amide (Diamid BM, (manufactured by Nippon Kasei Co., Ltd.) | 0.7 parts |
| Lauric acid amide (Diamid Y, (manufactured by Nippon Kasei Co., Ltd.) | 0.7 parts |
| Palmitic acid amide (Diamid KP, (manufactured by Nippon Kasei Co., Ltd.) | 0.7 parts |
| Erucic acid amide (Diamid L-200, (manufactured by Nippon Kasei Co., Ltd.) | 0.7 parts |
| Oleic acid amide (Diamid O-200, (manufactured by Nippon Kasei Co., Ltd.) | 0.7 parts |
| Nonionic surfactant (Chemistat 1100, manufactured by Sanyo Chemical Industries, Co., Ltd.) | 0.4 parts |
| Rosin (KE-311, manufactured by Arakawa Kagaku Co., Ltd.) components: resin acid 80–97%, resin acid components: abietic acid: 30 to 40% neoabietic acid: 10 to 20% dihydroabietic acid: 14% tetrahydroabietic acid: 14%) | 2.4 parts |
| Surfactant (Megafac F-176PF, solid content: 20%, manufactured by Dai-Nippon Ink & Chemicals Inc.) | 0.8 parts |
| n-Propyl alcohol | 793 parts |
| Methyl ethyl ketone | 198 parts |

The obtained image-forming layer had the following physical properties.

The surface hardness of the image-forming layer is preferably 10 g or more when measured with a sapphire needle, and specifically 200 g or more.

The Smooster value of the surface at 23° C., 55% RH is preferably from 0.5 to 50 mm Hg (=about 0.0665 to 6.65 kPa), and specifically 2.3 mm Hg (=about 0.31 kPa).

The coefficient of static friction of the surface is preferably 0.2 or less, and specifically 0.1.

Preparation of Heat Transfer Sheet M

Heat transfer sheet M was prepared in the same manner as in the preparation of heat transfer sheet K, except that the magenta image-forming layer coating solution having the composition shown below was used in place of the black image-forming layer coating solution. The layer thickness of the image-forming layer in the obtained heat transfer sheet M was 0.38 μm.

Composition of Magenta Pigment Dispersion Mother Solution

Magenta Pigment Composition 1

| | |
|---|---|
| Polyvinyl butyral (Denka Butyral #2000-L, manufactured by Denki Kagaku Kogyo Co., Ltd., Vicut softening point: 57° C.) | 12.6 parts |
| Pigment Red (pigment yellow 57:1, C.I. No. 15850:1) (Symuler Brilliant Carmine 6B-229, manufactured by Dainippon Chemicals and Ink Co., Ltd.) | 15.0 parts |
| Dispersing aid (Solspers S-20000, manufactured by ICI Co.) | 0.6 parts |
| n-Propyl alcohol | 80.4 parts |

Composition of Magenta Pigment Dispersion Mother Solution

Magenta Pigment Composition 2

| | |
|---|---|
| Polyvinyl butyral (Denka Butyral #2000-L, manufactured by Denki Kagaku Kogyo Co., Ltd., Vicut softening point: 57° C.) | 12.6 parts |
| Pigment Red 57:1 C.I. No. 15850) (Lionol Red 6B-4290G, manufactured by Toyo Ink Mfg. Co., Ltd.) | 15.0 parts |
| Dispersing aid (Solspers S-20000, manufactured by ICI Co.) | 0.6 parts |
| n-Propyl alcohol | 79.4 parts |

Composition of Magenta Image-forming Layer Coating Solution

| | |
|---|---|
| Above magenta pigment dispersion mother solution (magenta pigment composition 1/ magenta pigment composition 2: 95/5 (parts)) | 163 parts |
| Polyvinyl butyral (Denka Butyral #2000-L, manufactured by Denki Kagaku Kogyo Co., Ltd., Vicut softening point: 57° C.) | 4.0 parts |
| Wax-based compound | |
| Stearic acid amide (Newtron 2, manufactured by Nippon Seika Co., Ltd.) | 1.0 part |
| Behenic acid amide (Diamid BM, (manufactured by Nippon Kasei Co., Ltd.) | 1.0 part |
| Lauric acid amide (Diamid Y, (manufactured by Nippon Kasei Co., Ltd.) | 1.0 part |
| Palmitic acid amide (Diamid KP, (manufactured by Nippon Kasei Co., Ltd.) | 1.0 part |
| Erucic acid amide (Diamid L-200, (manufactured by Nippon Kasei Co., Ltd.) | 1.0 part |
| Oleic acid amide (Diamid O-200, (manufactured by Nippon Kasei Co., Ltd.) | 1.0 part |
| Nonionic surfactant (Chemistat 1100, manufactured by Sanyo Chemical Industries, Co., Ltd.) | 0.7 parts |
| Rosin (KE-311, manufactured by Arakawa Kagaku Co., Ltd.) components: resin acid 80–97%, resin acid components: abietic acid: 30 to 40% neoabietic acid: 10 to 20% dihydroabietic acid: 14% tetrahydroabietic acid: 14%) | 4.6 parts |

-continued

| | |
|---|---|
| Pentaerythritol tetraacrylate (NK ester A-TMMT, manufactured by Shin-Nakamura Kagaku Co., Ltd.) | 2.5 parts |
| Surfactant (Megafac F-176PF, solid content: 20%, manufactured by Dai-Nippon Ink & Chemicals Inc.) | 1.3 parts |
| n-Propyl alcohol | 848 parts |
| Methyl ethyl ketone | 246 parts |

The obtained image-forming layer had the following physical properties.

The surface hardness of the image-forming layer is preferably 10 g or more when measured with a sapphire needle, specifically 200 g or more.

The Smooster value of the surface at 23° C., 55% RH is preferably from 0.5 to 50 mm Hg (=about 0.0665 to 6.65 kPa), and specifically 3.5 mm Hg (=about 0.47 kPa).

The coefficient of static friction of the surface is preferably 0.2 or less, and specifically 0.08.

Preparation of Heat Transfer Sheet C

Heat transfer sheet C was prepared in the same manner as in the preparation of heat transfer sheet K, except that the cyan image-forming layer coating solution having the composition shown below was used in place of the black image-forming layer coating solution. The layer thickness of the image-forming layer in the obtained heat transfer sheet C was 0.45 $\mu$m.

Composition of Cyan Pigment Dispersion Mother Solution

Cyan Pigment Composition 1

| | |
|---|---|
| Polyvinyl butyral (Eslec B BL-SH, manufactured by Sekisui Chemical Industries, Ltd.) | 12.6 parts |
| Pigment Blue (pigment blue 54:7, C.I. No. 74160) (Cyanine Blue 700-10FG, manufactured by Toyo Ink Mfg. Co., Ltd.)) | 15.0 parts |
| Dispersing aid (PW-36, manufactured by Kusumoto Kasei Co., Ltd.) | 0.8 parts |
| n-Propyl alcohol | 110 parts |

Composition of Cyan Pigment Dispersion Mother Solution

Cyan Pigment Composition 2

| | |
|---|---|
| Polyvinyl butyral (Eslec B BL-SH, manufactured by Sekisui Chemical Industries, Ltd.) | 12.6 parts |
| Pigment Blue 15 (C.I. No. 74160, Lionol Blue 7027, manufactured by Toyo Ink Mfg. Co., Ltd.) | |
| Dispersing aid (PW-36, manufactured by Kusomoto Kasei Co., Ltd.) | 0.8 parts |
| n-Propyl alcohol | 110 parts |

Composition of Cyan Image-forming Layer Coating Solution

| | |
|---|---|
| Above cyan pigment dispersion mother solution (cyan pigment composition 1/ cyan pigment composition 2: 90/10 (parts)) | 118 parts |
| Polyvinyl butyral (Eslec B BL-SH, manufactured by Sekisui Chemical Industries, Ltd.) | 5.2 parts |
| Inorganic pigment (MEK-ST) | 1.3 parts |
| Wax-based compound | |
| Stearic acid amide (Newtron 2, manufactured by Nippon Seika Co., Ltd.) | 1.0 part |
| Behenic acid amide (Diamid BM, (manufactured by Nippon Kasei Co., Ltd.) | 1.0 part |
| Lauric acid amide (Diamid Y, (manufactured by Nippon Kasei Co., Ltd.) | 1.0 part |
| Palmitic acid amide (Diamid KP, (manufactured by Nippon Kasei Co., Ltd.) | 1.0 part |
| Erucic acid amide (Diamid L-200, (manufactured by Nippon Kasei Co., Ltd.) | 1.0 part |
| Oleic acid amide (Diamid O-200, (manufactured by Nippon Kasei Co., Ltd.) | 1.0 part |
| Rosin (KE-311, manufactured by Arakawa Kagaku Co., Ltd.) components: resin acid 80–97%, resin acid components: abietic acid: 30 to 40% neoabietic acid: 10 to 20% dihydroabietic acid: 14% tetrahydroabietic acid: 14%) | 2.8 parts |
| Pentaerythritol tetraacrylate (NK ester A-TMMT, manufactured by Shin-Nakamura Kagaku Co., Ltd.) | 1.7 parts |
| Surfactant (Megafac F-176PF, solid content: 20%, manufactured by Dai-Nippon Ink & Chemicals Inc.) | 1.7 parts |
| n-Propyl alcohol | 890 parts |
| Methyl ethyl ketone | 247 parts |

The obtained image-forming layer had the following physical properties.

The surface hardness of the image-forming layer is preferably 10 g or more when measured with a sapphire needle, and specifically 200 g or more.

The Smooster value of the surface at 23° C., 55% RH is preferably from 0.5 to 50 mm Hg (=about 0.0665 to 6.65 kPa), and specifically 7.0 mm Hg (=about 0.93 kPa).

The coefficient of static friction of the surface is preferably 0.2 or less, and specifically 0.08.

Preparation of Image-receiving Sheet

Image-receiving Sheet A

The cushioning layer coating solution and the image-receiving layer coating solution each having the following composition were prepared.

1) Cushioning Layer Coating Solution

| | |
|---|---|
| Vinyl chloride-vinyl acetate copolymer (main binder, MPR-TSL, manufactured by Nisshin Kagaku Co., Ltd.) | 20 parts |
| Plasticizer (Paraplex G-40, manufactured by CP. HALL. COMPANY) | 10 parts |
| Surfactant (fluorine surfactant, coating assistant, Megafac F-177, manufactured by Dainippon Chemicals and Ink Co., Ltd.) | 0.5 parts |
| Antistatic agent (quaternary ammonium salt, SAT-5 Supper (IC), manufactured by Nippon Junyaku Co., Ltd.) | 0.3 parts |

-continued

| | |
|---|---|
| Methyl ethyl ketone | 60 parts |
| Toluene | 10 parts |
| N,N-Dimethylformamide | 3 parts |

2) Image-receiving Layer Coating Solution

| | |
|---|---|
| Polyvinyl butyral (Eslec B BL-SH, manufactured by Sekisui Chemical Industries, Ltd.) | 8 parts |
| Antistatic agent Sanstat 2012A, manufactured by Sanyo Chemical Industries, Co., Ltd.) | 0.7 parts |
| Surfactant (Megafac F-177, manufactured by Dainippon Chemicals and Ink Co., Ltd.) | 0.1 parts |
| n-Propyl alcohol | 20 parts |
| Methanol | 20 parts |
| 1-Methoxy-2-propanol | 50 parts |

The above-prepared cushioning layer coating solution was coated on a white PET support (Lumiler # 130E58, manufactured by Toray Industries Inc., thickness: 130 μm) with a narrow-broad coater and the coated layer was dried, and then the image-receiving layer coating solution was coated and dried. The coating amounts were controlled so that the layer thickness of the cushioning layer after drying became about 20 μm and the layer thickness of the image-receiving layer after drying became about 2 μm. The white PET support was a void-containing plastic support of a laminate (total thickness: 130 μm, specific gravity: 0.8) comprising a void-containing polyethylene terephthalate layer (thickness: 116 μm, void ratio: 20%), and titanium oxide-containing polyethylene terephthalate layers provided on both sides thereof (thickness: 7 μm, titanium oxide content: 2%). The prepared material was wound in a roll, stored at room temperature for one week, then used in the image recording by laser beam as shown below.

The obtained image-receiving layer had the following physical properties.

The Smooster value of the surface of the image-receiving layer at 23° C., 55% RH is preferably from 0.5 to 50 mm Hg (=about 0.0665 to 6.65 kPa), and specifically 0.8 mm Hg (=about 0.11 kPa).

The coefficient of static friction of the surface of the image-receiving layer is preferably 0.7 or less, and specifically 0.37.

Image-receiving Sheet B

Image-receiving sheet B was prepared according to the same formulation as in the preparation of image-receiving sheet A except that 0.5 mass parts of polymethacrylate particles having a particle size of 5 μm (manufactured by Soken Kagaku Co., Ltd.) was added to the image-receiving layer coating solution.

Image-receiving Sheet C

Image-receiving sheet C was prepared according to the same formulation as in the preparation of image-receiving sheet A except that the equimolecular amount of citric acid polyester was added to the cushioning layer coating solution in place of the plasticizer Paraplex G-40 used in image-receiving sheet A.

Each of above-prepared image-receiving sheets A to C (56 cm×79 cm) was wound around the recording drum having a diameter of 38 cm provided with vacuum suction holes having a diameter of 1 mm (surface density of 1 hole in the area of 3 cm×8 cm) and vacuum sucked. Before forming a transfer image, each image-receiving sheet was cleaned with an adhesive roller. The adhesive rollers used and the physical properties of the image-receiving sheets are shown in Table 4 below.

TABLE 4

| | Adhesive Roller | | Image-Receiving Sheet | | | |
|---|---|---|---|---|---|---|
| Example No. | Crown Shape | Pressing Controlling Member | Image-Receiving Sheet | Adhesive Strength of Image-Receiving Layer/Cushioning Layer (mN/cm) | Static Friction Coefficient | Rz (μm) |
| Example 1 | Yes | Present | A | 50 | 0.35 | 0.40 |
| Example 2 | Yes | Present | B | 55 | 0.22 | 3.5 |
| Comparative Example 1 | Yes | Present | C | 10 | 0.36 | 0.42 |
| Example 3 | Yes | Absent | A | 50 | 0.35 | 0.40 |
| Comparative Example 2 | No | Present | A | 50 | 0.35 | 0.40 |
| Comparative Example 3 | No | Absent | A | 50 | 0.35 | 0.40 |

In above Table 4, the adhesive rollers used in the case corresponding to "Yes" in the column "Crown Shape" are those which satisfy all the conditions of the above (A1) to (A3), specifically, the rollers of a crown shape having the central diameter D of 40 mm, the diameter d of the end part of 9.9 mm, and the length of the roller L of 500 mm. "No" in the column "Crown Shape" means that the adhesive rollers of a straight type are used.

"Present" in the column "Pressing Controlling Member" means that the pressing controlling member of $d-d_c=1$ mm in Table 3 above is used.

The adhesive strength of image-receiving layer/cushioning layer was measured according to the following method.

A sample of an image-receiving sheet (4.5 cm×16 cm) was put on a stand and adhered with the image-receiving layer faced the stand side with an adhesive tape (e.g., a polyester adhesive tape No. 31B 75 high, manufactured by Nitto Denko Co., Ltd.). In the next place, the cushioning layer was peeled off the image-receiving layer by an adhesive tape using a force gauge (e.g., FGX-2, manufactured by Nippon Densan Shinpo Co., Ltd.) at an angle of 180° to the image-receiving layer at peeling velocity of 1,500 mm/min. The adhesive strength was obtained by measuring the load (g) applied at this time and calculating in terms of the unit length (cm).

A static friction coefficient was measured as follows.

A sample of an image-receiving sheet (5 cm×20 cm) was put on a stand and adhered with the support faced the stand side with an adhesive tape (e.g., a polyester adhesive tape No. 31B 75 high, manufactured by Nitto Denko Co., Ltd.). A stainless steel terminal (35 mm×75 mm, curved surface of a radius of 2.5 mm, 200 g) having a smooth surface was put on the image-receiving layer, and the stand was slanted slowly. The angle of inclination of the stand of the time when the stainless steel terminal began to slide was measured, and the static friction coefficient was obtained as tan θ.

Formation of Transferred Image

The above heat transfer sheet K (black) cut into a size of 61 cm×84 cm was superposed on the image-receiving sheet fixed on the recording drum so as to deviate from the image-receiving sheet uniformly, squeezed by a squeeze roller, and closely adhered and laminated so that air was sucked by suction holes. The degree of pressure reduction in the state of suction holes being covered was −150 mm Hg per 1 atm (=about 81.13 kPa). The drum was rotated and semiconductor laser beams of the wavelength of 808 nm were condensed from the outside on the surface of the laminate on the drum so that the laser beams became a spot of a diameter of 7 $\mu$m on the surface of the light-to-heat converting layer, and laser image recording (line image) was performed on the laminate by moving the laser beam at a right angle (sub-scan) to the rotary direction of the drum (main scanning direction). The condition of laser irradiation was as follows. The laser beams used in the example was multi-beam two dimensional array comprising five rows along the main scanning direction and three rows along the sub-scan direction forming a parallelogram.

Laser power: 110 mW

Drum rotation speed: 500 rpm

Sub-scan pitch: 6.35 $\mu$m

Circumferential temperature and humidity conditions:

Three conditions of 18° C. 30%, 23° C. 50%, 26° C. 65%

The diameter of exposure drum is preferably 360 mm or more, and specifically 380 mm was used.

The size of the image was 515 mm×728 mm, and the resolution was 2,600 dpi.

The laminate finished laser recording was detached from the drum and heat transfer sheet K was peeled from the image-receiving sheet manually. It was confirmed that only the irradiated area of the image-forming layer in heat transfer sheet K had been transferred from heat transfer sheet K to the image-receiving sheet.

In the same manner as above, the image was transferred to the image-receiving sheet from each of heat transfer sheet Y, heat transfer sheet M and heat transfer sheet C.

Evaluation

1) Image defect due to foreign matters

The transferred image was visually observed and the number of image defects due to foreign matters, e.g., clear spots, was confirmed.

○: The number of image defect is 1 or less.

Δ: The number of image defects is from 2 to 10.

x: The number of image defects is 11 or more.

2) Peeling of Image-receiving Layer

The surface of each image-receiving sheet was observed just after cleaning with the adhesive roller, and evaluated by the following criteria.

○: Peeling of the image-receiving layer was not generated.

Δ: A part of the image-receiving layer was peeled.

x: The image-receiving layer was peeled off all over the surface.

The results of evaluation are shown in Table 5 below.

TABLE 5

| Example No. | Image Defect due to Foreign Matters | Peeling of Image-Receiving Layer |
|---|---|---|
| Example 1 | ○ | ○ |
| Example 2 | ○ | ○ |
| Comparative Example 1 | ○ | X |
| Example 3 | Δ | Δ |
| Comparative Example 2 | X | X |
| Comparative Example 3 | X | X |

It can be seen from the results of evaluation that the images obtained according to the present invention are less in image defects due to foreign matters and the peeling of the image-receiving layer when the surface of the image-receiving sheet is subjected to cleaning by the adhesive roller is suppressed. It is also understood that the crown shape of the adhesive roller for cleaning and the pressing controlling members provided at both ends of the roller are effective for preventing the generation of image defects and peeling of the image-receiving layer.

Further, when images of four colors formed by transfer were re-transferred to a printing paper to form a multicolor image, a multicolor image having excellent image quality and stable transfer density could be obtained even in the case of high energy laser recording by multi-beam two dimensional array under different temperature and humidity conditions.

In the stage of transfer to the actual paper, the heat transfer unit having a dynamic friction coefficient against insert platform of polyethylene terephthalate of from 0.1 to 0.7 and traveling speed of from 15 to 50 mm/sec was used. The Vickers hardness of the material of the heat roller of the heat transfer unit is preferably from 10 to 100. Specifically, the heat roller having Vickers hardness of 70 was used.

Every image obtained under three different surroundings of temperature humidity conditions was good.

EFFECT OF THE INVENTION

The present invention can provide a laser-heat transfer method capable of producing an image free of image defects due to the adhesion of foreign matters such as dusts on an image-receiving sheet. The present invention can provide an adhesive roller for cleaning capable of cleaning an image-receiving sheet without peeling an image-receiving layer.

The present invention can provide contract a proof corresponding to film-less CTP system and contract proof substituting analog style color proofs. By this proof, color reproduction which coincides with printed matters and analog style color proofs for obtaining the approval of customers can be realized. The present invention can provide DDCP system by using the same pigment materials as used in the printing inks, effecting transfer to actual paper and generating no moire. The present invention can also provide a large sized high grade DDCP (A2/B2) capable of transferring to actual paper, capable of using the same pigment materials as used in the printing inks, and showing high approximation to printed matters. The system of the present invention is a system adopting laser membrane transfer, using pigment coloring materials and capable of transferring to actual paper by real dot recording. According to the multicolor image-forming system according to the present invention, even when laser recording by high energy using multi-beam two dimensional array under different temperature humidity conditions is performed, an image having good image quality and stable transfer density can be formed on the image-receiving sheet.

The entitle disclosure of each and every foreign patent application from which the benefit of foreign priority has been claimed in the present application is incorporated herein by reference, as if fully set forth herein.

While the invention has been described in detail and with reference to specific examples thereof, it will be apparent to one skilled in the art that various changes and modifications can be made therein without departing from the spirit and scope thereof.

What is claimed is:

1. A laser-heat transfer recording method comprising the image-recording steps of feeding an image-receiving sheet having an image-receiving layer and a heat transfer sheet comprising a support having provided thereon at least a light-to-heat converting layer and an image-forming layer to an exposure-recording unit; fixing the image-forming layer in the heat transfer sheet and the image-receiving layer in the image-receiving sheet being superposed vis-a-vis on a recording medium fixing member of the exposure-recording unit; irradiating the heat transfer sheet with laser beams corresponding to image data; and transferring the irradiated area with laser beams of the image-forming layer onto the image-receiving layer in the image-receiving sheet; wherein the surface of the image-receiving sheet is cleaned by being brought into contact with an adhesive roll of a crown shape for removing foreign matters, the diameter of the central part of which is larger than the diameters of both ends in the axis direction of the roll body, provided at at least one of the feeding part of the image-receiving sheet and the heat transfer sheet of the exposure-recording unit, a carrying part and a recording part, and the adhesive strength of the image-receiving layer and the underlayer of the image-receiving layer in the image-receiving sheet is from 20 to 100 mN/cm.

2. The laser-heat transfer recording method as claimed in claim 1, wherein the static friction coefficient of the image-receiving layer surface in the image-receiving sheet is 0.7 or less.

3. The laser-heat transfer recording method as claimed in claim 1, wherein the surface roughness Rz of the image-receiving layer surface in the image-receiving sheet is from 1 to 5 $\mu$m.

4. The laser-heat transfer recording method as claimed in claim 1, wherein pressing controlling members made of a harder material than the material of the adhesive member are provided at both ends of the adhesive roll.

5. The laser-heat transfer recording method as claimed in claim 1, wherein the cleaning of the surface of the image-receiving sheet by the adhesive roll comprises the steps of fixing the image-receiving sheet on the recording medium-fixing member, cleaning the surface from almost the central part of the relative moving direction of the image-receiving sheet toward one end of the relative moving direction by keeping the adhesive roll in contact with the surface; and thereafter cleaning the surface from almost the central part of the relative moving direction of the image-receiving sheet toward another end of the relative moving direction by keeping the adhesive roll in contact with the surface.

* * * * *